United States Patent
Morooka

(10) Patent No.: US 10,971,510 B2
(45) Date of Patent: Apr. 6, 2021

(54) SEMICONDUCTOR MEMORY DEVICE

(71) Applicant: TOSHIBA MEMORY CORPORATION, Tokyo (JP)

(72) Inventor: Tetsu Morooka, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/295,762

(22) Filed: Mar. 7, 2019

(65) Prior Publication Data

US 2020/0098767 A1 Mar. 26, 2020

(30) Foreign Application Priority Data

Sep. 20, 2018 (JP) .............................. JP2018-175851

(51) Int. Cl.
| | |
|---|---|
| *H01L 27/1157* | (2017.01) |
| *H01L 27/11524* | (2017.01) |
| *G11C 16/04* | (2006.01) |
| *H01L 27/11551* | (2017.01) |
| *H01L 27/11578* | (2017.01) |

(52) U.S. Cl.
CPC ...... *H01L 27/1157* (2013.01); *G11C 16/0483* (2013.01); *H01L 27/11524* (2013.01); *H01L 27/11551* (2013.01); *H01L 27/11578* (2013.01)

(58) Field of Classification Search
CPC ........... H01L 27/11565; H01L 27/1157; H01L 27/11548; H01L 27/11524; H01L 27/11556; H01L 27/11582; H01L 27/11578; H01L 27/11551; H01L 29/40117; H01L 29/40114

See application file for complete search history.

(56) References Cited

U.S. PATENT DOCUMENTS

| | | | |
|---|---|---|---|
| 9,711,522 B2 | 7/2017 | Park et al. | |
| 2009/0230454 A1* | 9/2009 | Pekny ............... | H01L 27/11556 257/319 |
| 2015/0171098 A1 | 6/2015 | Simsek-Ege et al. | |
| 2015/0214239 A1 | 7/2015 | Rhie | |
| 2016/0260732 A1* | 9/2016 | Lue .................. | H01L 27/11565 |
| 2017/0062456 A1 | 3/2017 | Sugino et al. | |
| 2017/0271348 A1 | 9/2017 | Arai et al. | |
| 2018/0019257 A1 | 1/2018 | Son | |

FOREIGN PATENT DOCUMENTS

| | | |
|---|---|---|
| TW | 201532131 A | 8/2015 |
| TW | 201539454 A | 10/2015 |
| TW | 201633510 A | 9/2016 |

* cited by examiner

*Primary Examiner* — Vongsavanh Sengdara
(74) *Attorney, Agent, or Firm* — Foley & Lardner LLP

(57) ABSTRACT

According to one embodiment, a semiconductor memory device includes: a substrate; a plurality of wiring layers stacked via a plurality of insulating layers above the substrate, the wiring layers having an opening extending in a direction perpendicular to the substrate, each of the wiring layers including a first face recessed in a first direction, a second face recessed in a second direction, third face recessed in a third direction, and a fourth face recessed in a fourth direction; a block insulating film provided to be in contact with each of the first to fourth faces; a charge storage film provided on a side face of the block insulating film; a tunnel insulating film provided on a side face of the charge storage film; and a semiconductor film provided on a side face of the tunnel insulating film.

13 Claims, 29 Drawing Sheets

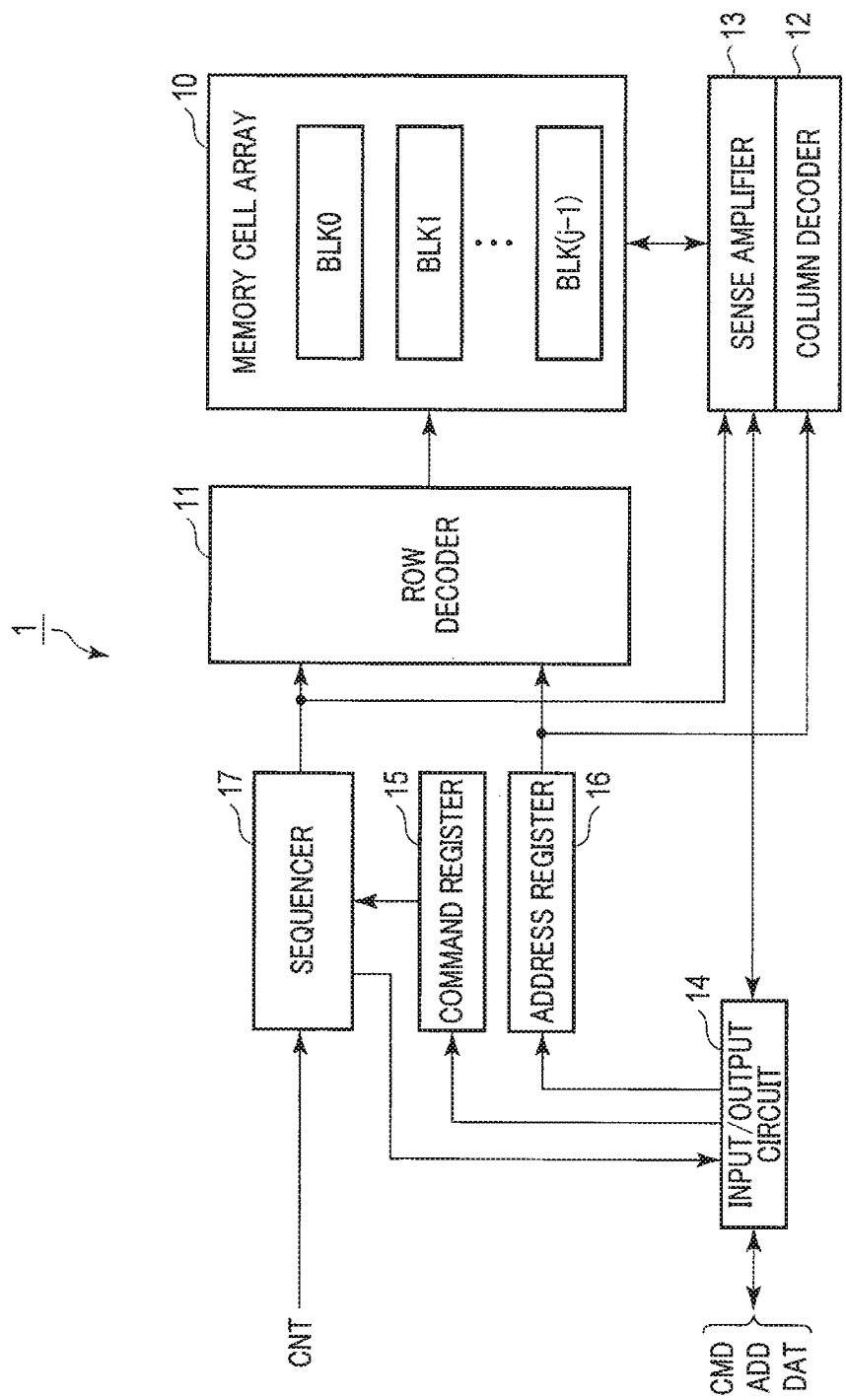
F I G. 1

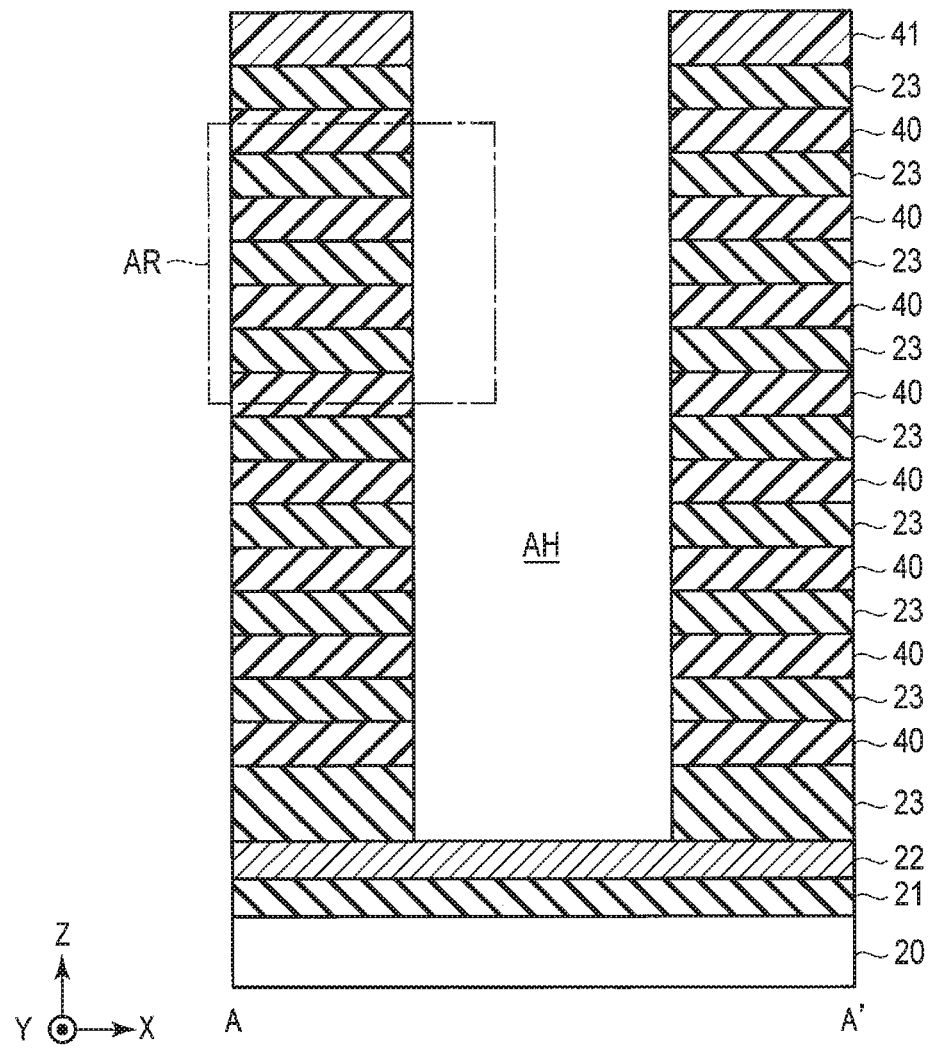
F I G. 10

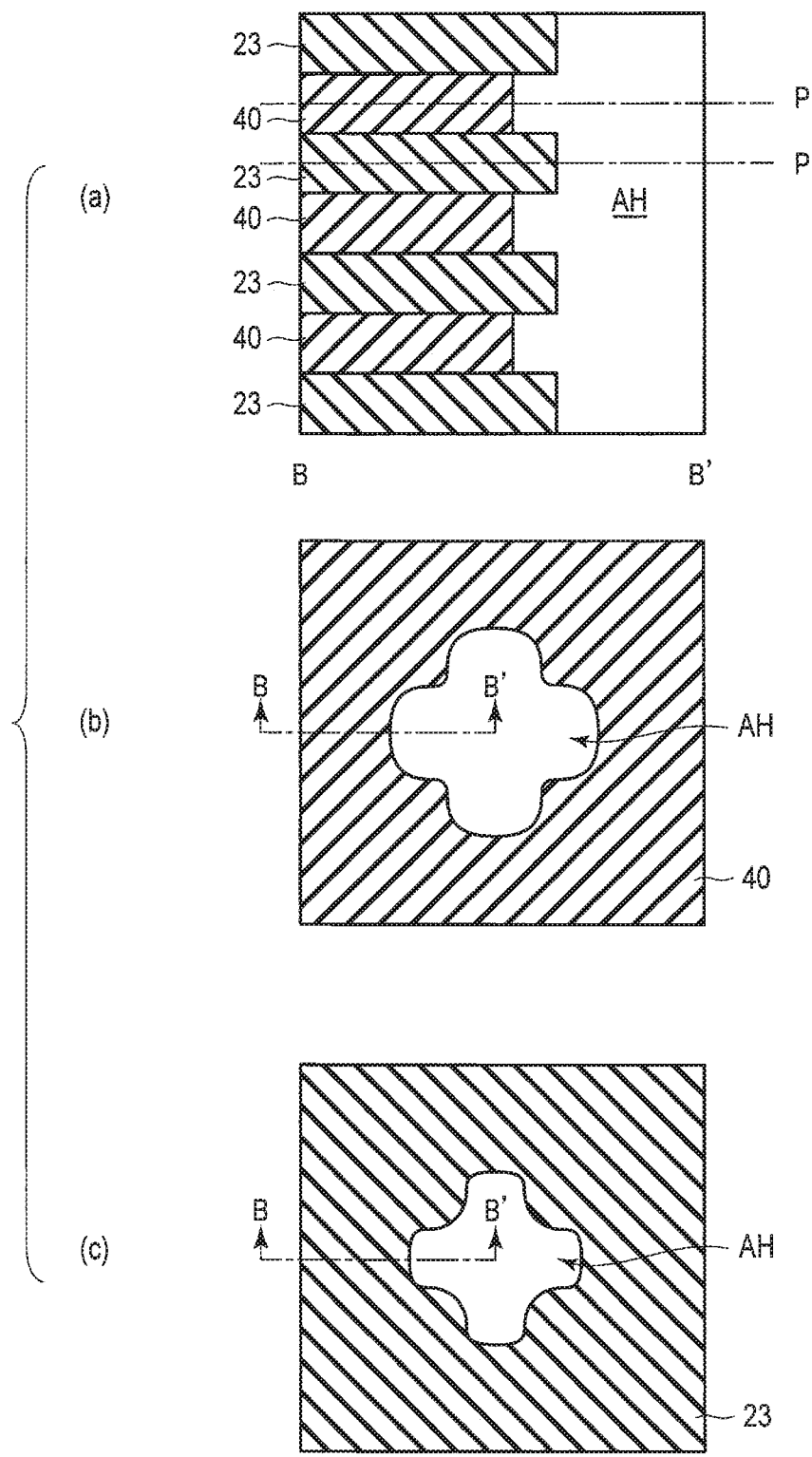
F I G. 12

SEMICONDUCTOR MEMORY DEVICE

CROSS-REFERENCE TO RELATED APPLICATIONS

This application is based upon and claims the benefit of priority from Japanese Patent Application No. 2018-175851, filed Sep. 20, 2018, the entire contents of which are incorporated herein by reference.

FIELD

The embodiments of the present invention relate generally to a semiconductor memory device.

BACKGROUND

A NAND flash memory is known as a kind of semiconductor memory device. A NAND flash memory comprising three-dimensionally stacked memory cell transistors is also known.

BRIEF DESCRIPTION OF THE DRAWINGS

FIG. 1 is a block diagram illustrating a semiconductor memory device according to an embodiment;

FIG. 10 is a sectional view illustrating the method of manufacturing the memory cell array and shows a state after FIG. 8;

FIG. 12 is a view illustrating the method of manufacturing the memory cell array and shows a state after FIG. 11;

DETAILED DESCRIPTION

Figure 2:
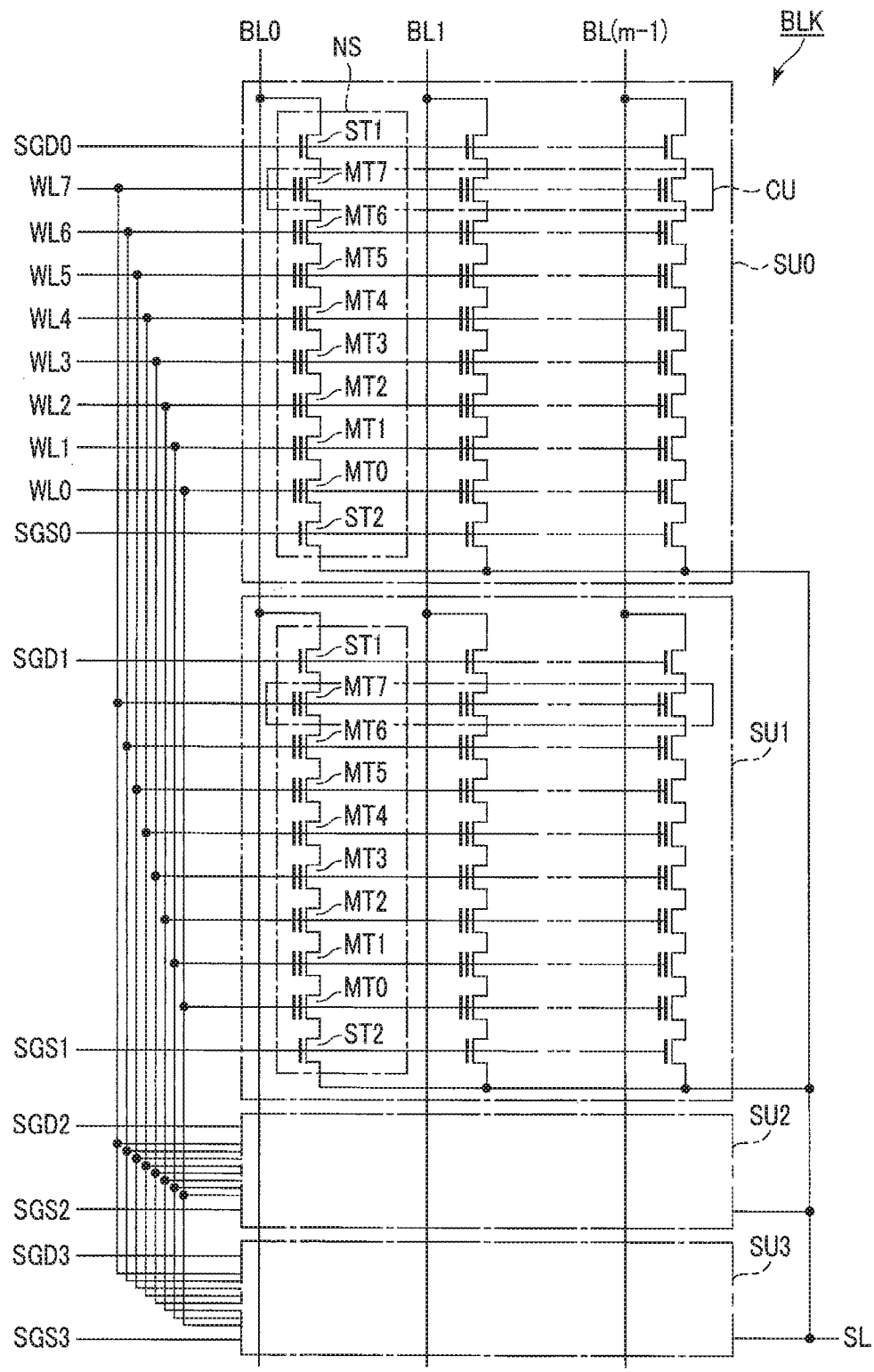
FIG. 2 is a circuit diagram of one block BLK included in a memory cell array.

In general, according to one embodiment, there is provided a semiconductor memory device comprising:

a substrate;

a plurality of wiring layers stacked via a plurality of insulating layers above the substrate, the wiring layers having an opening extending in a direction perpendicular to the substrate, each of the wiring layers including a first face recessed in a first direction parallel to a surface of the substrate, a second face recessed in a second direction parallel to the surface of the substrate and different from the first direction, a third face recessed in a third direction parallel to the surface of the substrate and different from the first and second directions, and a fourth face recessed in a fourth direction parallel to the surface of the substrate and different from the first to third directions;

a block insulating film provided to be in contact with each of the first to fourth faces;

a charge storage film provided on a side face of the block insulating film;

a tunnel insulating film provided on a side face of the charge storage film; and a semiconductor film provided on a side face of the tunnel insulating film.

A description will now be given of the embodiments with reference to the accompanying drawings. Several embodiments described below merely show exemplary apparatuses and methods that implement the technical ideas of the present invention. The technical ideas are not limited by the element shapes, structures, arrangements etc. described below. It should be noted that the drawings are schematic or conceptual, and the relationships between the thickness and the width of each part and the proportions between the parts are not necessarily the same as the actual ones. Where the same portion is depicted in different drawings, the dimensions and proportions shown in one drawing may be different from those shown in another. In the description below, elements having the same functions and configurations will be denoted by the same reference symbols, and a detailed description of such elements will be omitted. A description will be given of different portions.

[1] Configuration of Semiconductor Memory Device 1

[1-1] Overall Configuration of Semiconductor Memory Device 1

An overall configuration of a semiconductor memory device 1 will described. The semiconductor memory device 1 according to the present embodiment is a NAND flash memory capable of storing data in a nonvolatile manner.

FIG. 1 is a block diagram illustrating the semiconductor memory device 1 according to the embodiment.

The semiconductor memory device 1 comprises a memory cell array 10, a row decoder 11, a column decoder 12, a sense amplifier 13, an input/output circuit 14, a command register 15, an address register 16, a sequencer (control circuit) 17, etc.

The memory cell array 10 includes j blocks BLK0 to BLK(j−1) integer not less than 1. Each of the blocks is provided with a plurality of memory cell transistors. The memory cell transistors are made of electrically rewritable memory cells. A plurality of bit lines, a plurality of word lines and a source line are arranged in the memory cell array 10 so as to control the voltages applied to the respective memory cell transistors. A specific configuration of blocks BLK will be described later.

The row decoder 11 receives a row address from the address register 16 and decodes this row address. The row decoder 11 performs a selection operation of, for example, word lines, based on the decoded row address. The row decoder 11 transfers the voltages required for the write operation, read operation and erase operation to the memory cell array 10.

The column decoder 12 receives a column address from the address register 16 and decodes this column address. The column decoder 12 performs a selection operation of bit lines, based on the decoded column address.

In a read operation, the sense amplifier 13 senses and amplifies data that is read from a memory cell transistor to a bit line. In a write operation, the sense amplifier 13 transfers write data to a bit line.

The input/output circuit 14 is connected to an external device (host device) via a plurality of input/output lines (DQ lines). The input/output circuit 14 receives command CMD and address ADD from the external device. The command CMD received by the input/output circuit 14 is sent to the command register 15. The address ADD received by the input/output circuit 14 is sent to the address register 16. Further, the input/output circuit 14 exchanges data DAT with reference to the external device.

The sequencer 17 receives control signals CNT from the external device. The control signals CNT include a chip enable signal CEn, a command latch enable signal CLE, an address latch enable signal ALE, a write enable signal WEn, a read enable signal REn, and the like. The "n" suffixed to the signal names indicates an active row. The sequencer 17 controls the operation of the entire semiconductor memory device 1 based on the command CMD stored in the command register 15 and control signal CNT.

[1-2] Configuration of Memory Cell Array 10

Next, a circuit configuration of the memory cell array 10 will be described. FIG. 2 is a circuit diagram of one block BLK included in the memory cell array 10.

Each of the blocks BLK is provided with a plurality of string units SU. In FIG. 2, four string units SU0 to SU3 are shown by way of example. The number of string units SU included in one block BLK can be optionally determined.

Each of the string units SU includes a plurality of NAND strings (memory strings) NS. The number of NAND strings NS included in one string unit SU can be optionally determined.

Each of the NAND strings NS includes a plurality of memory cell transistors MT and two select transistors ST1 and ST2. The memory cell transistors MT are connected in series between the source of select transistor ST1 and the drain of select transistor ST2. In the present specification, the memory cell transistors may be referred to as memory cells or cells. For the sake of simplicity, FIG. 2 shows a configuration example in which NAND string NS is provided with eight memory cell transistors MT (MT0 to MT7), but the number of memory cell transistors MT provided in NAND string NS is larger in practice and can be optionally determined. Each of the memory cell transistors MT includes a control gate and a charge storage layer, and holds data in a nonvolatile manner. Each memory cell transistor MT can hold data of one bit or data of two or more bits.

The gates of select transistors ST1 of string unit SU0 are commonly connected to select gate line SGD0. Likewise, the gates of select transistors ST1 of string units SU1 to SU3 are connected to select gate lines SGD1 to SGD3, respectively. The gates of select transistors ST2 of string unit SU0 are commonly connected to select gate line SGS0. Likewise, the gates of select transistors ST2 of string units SU1 to SU3 are connected to select gate lines SGS1 to SGS3, respectively. It should be noted that a common select gate line SGS may be connected to string units SU0 to SU3 included in each block BLK. The control gates of memory cell transistors MT0 to MT7 included in each block BLK are connected to word lines WL0 to WL7, respectively.

Of the NAND strings NS arranged in the matrix pattern in each block BLK, the NAND strings NS of the same row are configured such that the drains of their select transistors ST1 are commonly connected to a given one of bit lines BL0 to BL(m−1). "m" is an integer not less than 1. Further, each bit line BL is commonly connected to a plurality of blocks BLK, and is connected to one NAND string NS in each string unit SU included in each of the blocks BLK. The sources of select transistors ST2 included in each block BLK are commonly connected to a source line SL. Source line SL is commonly connected to a plurality of blocks BLK, for example.

The data in a plurality of memory cell transistors MT included in each block BLK can be erased in a collective manner, for example. Read and write operations are collectively performed for a plurality of memory cell transistors MT that are commonly connected to one word line WL of one string unit SU. A set of memory cell transistors MT that share the same word line in each string unit are referred to as a cell unit CU. The 1-bit data stored in a plurality of memory cell transistors MT included in cell unit CU is referred to as a page. In other words, the write operation and the read operation for cell unit CU are performed in, units of pages.

The NAND strings NS may be provided with dummy cell transistors. To be specific, for example, two dummy cell transistors (not shown) are connected in series between select transistor ST2 and memory cell transistor MT0. For example, two dummy cell transistors (not shown) are connected in series between memory cell transistor MT7 and select transistor ST1. A plurality of dummy word lines are connected to the gates of the dummy cell transistors, respectively. The configurations of the dummy cell transistors are similar to those of the memory cell transistors. The dummy cell transistors are not for storing data and have a function of relieving the disturbance which the memory cell transistors and select transistors may undergo during the write operation and erase operation.

[1-3] Configuration of Memory Cell Array 10

Figure 3:
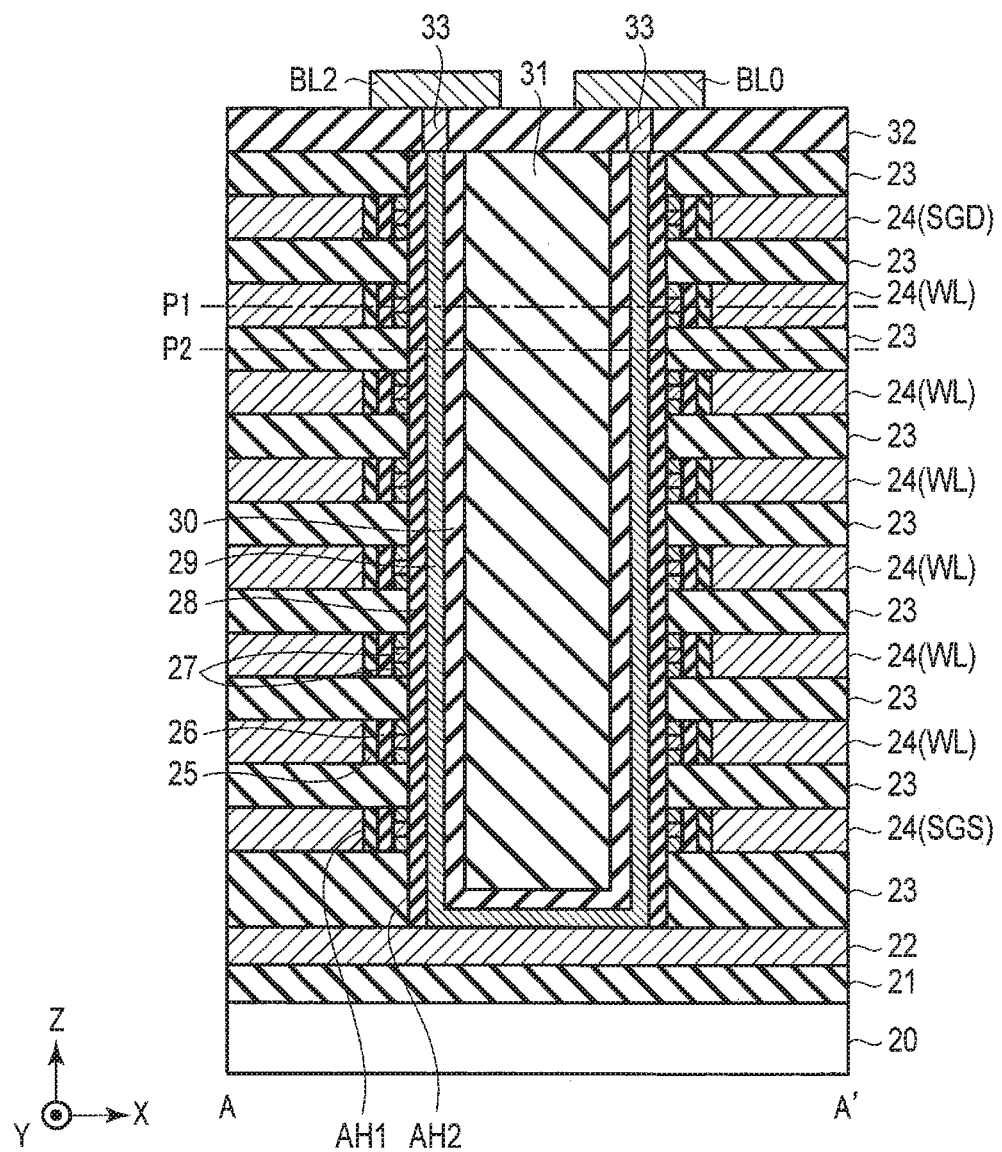
FIG. 3 is a sectional view of a memory cell array.
Figure 4:
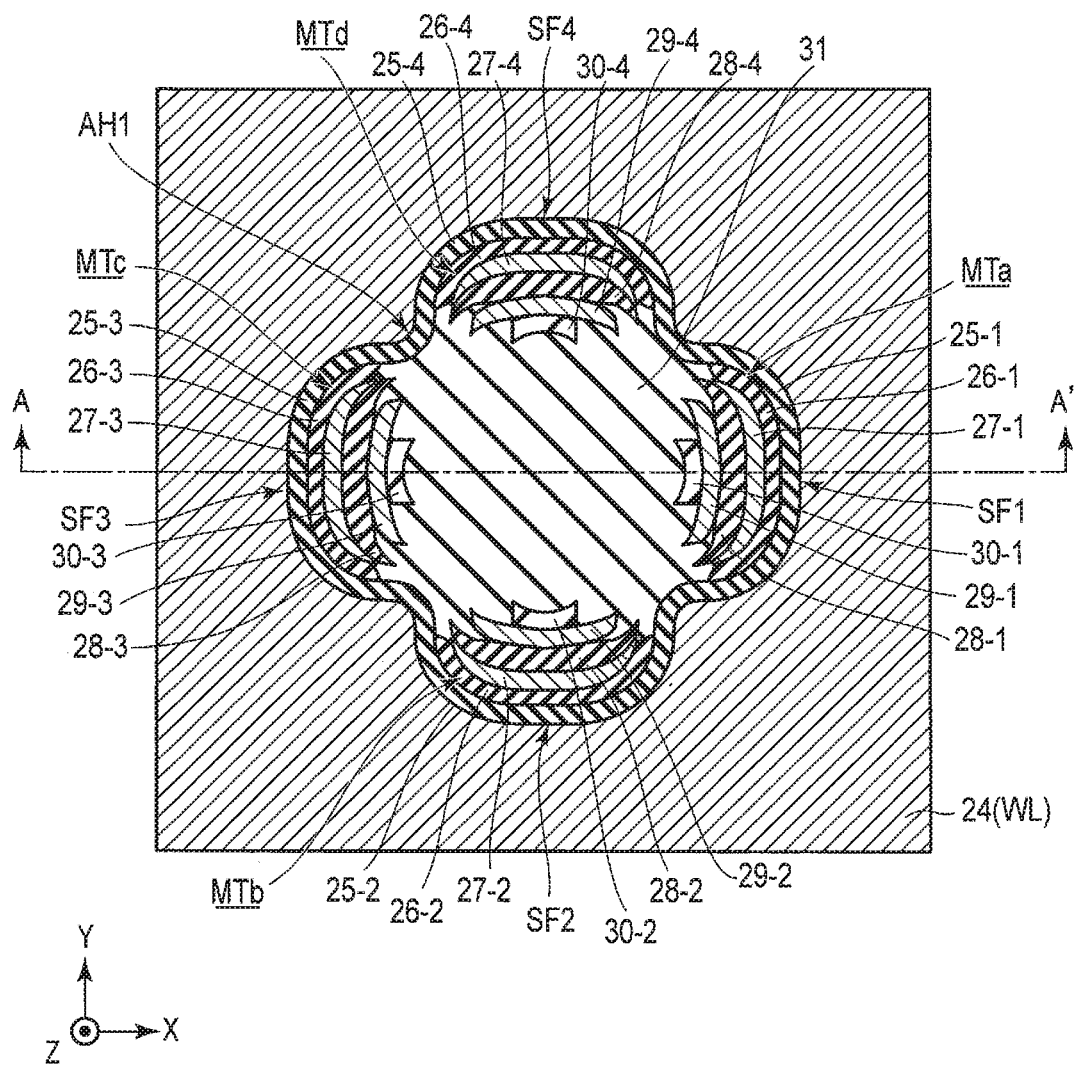
FIG. 4 is a plan view illustrating how the memory cell array is at position P1 shown in FIG. 3.
Figure 5:
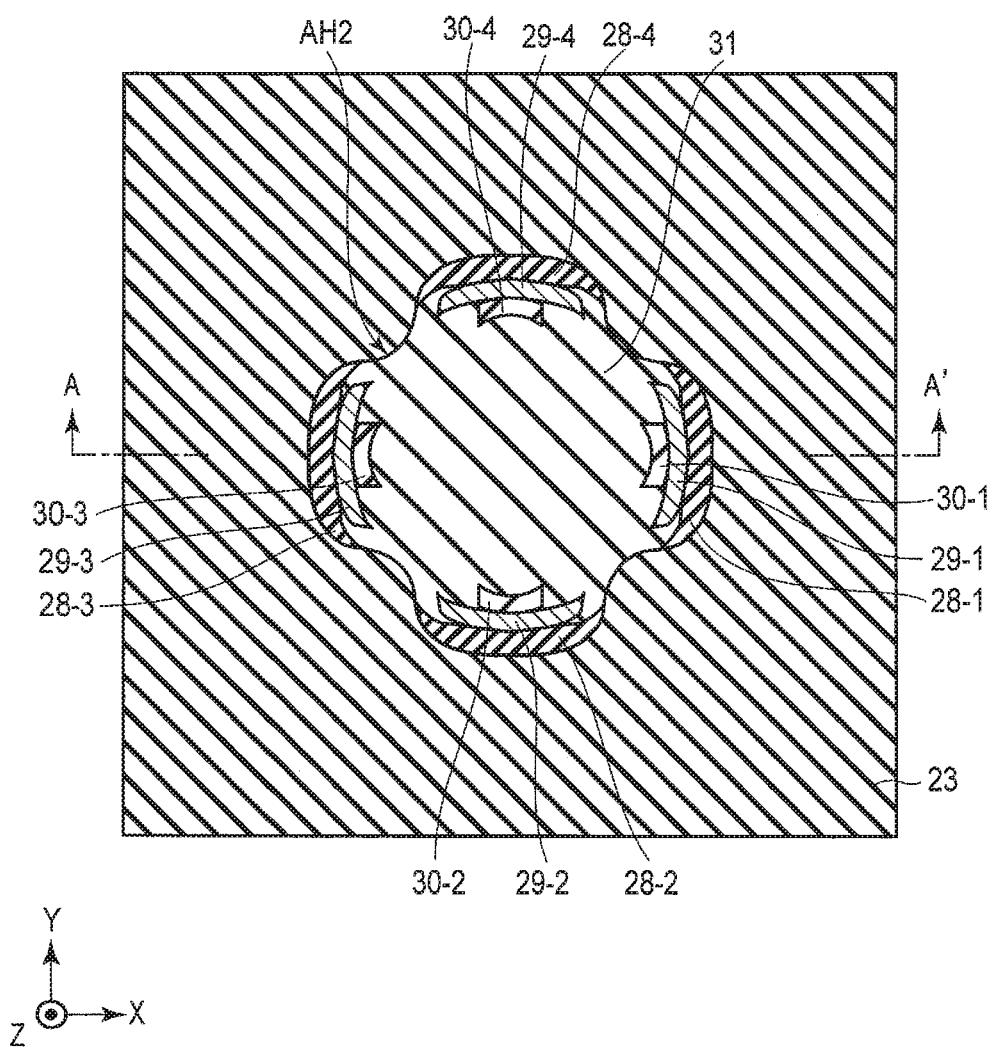
FIG. 5 is a plan view illustrating how the memory cell array is at position P2 shown in FIG. 3.

Next, a configuration of the memory cell array 10 will be described. FIG. 3 is a sectional view of the memory cell array 10. FIG. 4 is a plan view illustrating how the memory cell array 10 is at position P1 shown in FIG. 3. FIG. 5 is a plan view illustrating how the memory cell array 10 is at position P2 shown in FIG. 3. The sectional view shown in FIG. 3 corresponds to the view taken along line A-A' of FIGS. 4 and 5. In this specification, the X direction and the Y direction are defined as being perpendicular to each other in a horizontal plane, and the Z direction is defined as the stacking direction.

On a substrate (for example, a silicon substrate) 20, an insulating layer 21 formed of, for example, silicon oxide ($SiO_2$) and a conductive layer 22 formed of, for example, polycrystalline silicon are stacked in this order. The conductive layer 22 functions as a source line SL. For example, the source line SL is formed such that it spreads over the XY plane. The source line SL may be formed of a laminated film in which a conductive layer formed of polycrystalline silicon, a metal layer formed, for example, of tungsten (W) and a conductive layer formed of polycrystalline silicon are stacked in this order.

Above the conductive layer 22, for example, a single wiring layer 24 functioning as select gate lines SGS, a plurality of wiring layers 24 functioning as word lines WL, and a single wiring layer functioning as select gate lines SGD are stacked in this order, with respective interlayer insulating layers 23 interposed. The interlayer insulating layers 23 are formed of silicon oxide, for example. The wiring layers 24 are formed of tungsten (W), for example. Each wiring layer 24 may be provided with a barrier metal film (for example, titanium nitride (TiN)) covering the upper face, side faces, and bottom face of the main body portion of tungsten (W). The number of stacked word lines WL shown in FIG. 3 is just an example, and a far larger number of word lines WL are stacked in practice. Select gate lines SGS are not limited to those formed by one layer, and may be formed by three wiring layers 24, for example. Select gate lines SGD are not limited to those formed by one layer, and may be formed by three wiring layers 24, for example.

As shown in FIG. 4, each of the wiring layers 24 is provided with a cross-shaped opening (memory hole) AH1. That is, the wiring layer 24 has first to fourth faces (curved faces) SF1 to SF4. In FIG. 4, four directions are defined such that the direction toward the right side of the X axis is +X direction, the direction toward the left side of the X axis is −X direction, the direction toward the upper side of the Y axis is +Y direction, and the direction toward the lower side is −Y direction. The first face SF1 is a curved face depressed in the +X direction. The second face SF2 is a curved face depressed in the −Y direction. The third face SF3 is a curved face depressed in the −X direction. The fourth face SF4 is a curved face depressed in the +Y direction. By these four curved faces (the first to fourth faces SF1 to SF4), the cross-shaped opening AH1 is formed.

Figure 6:
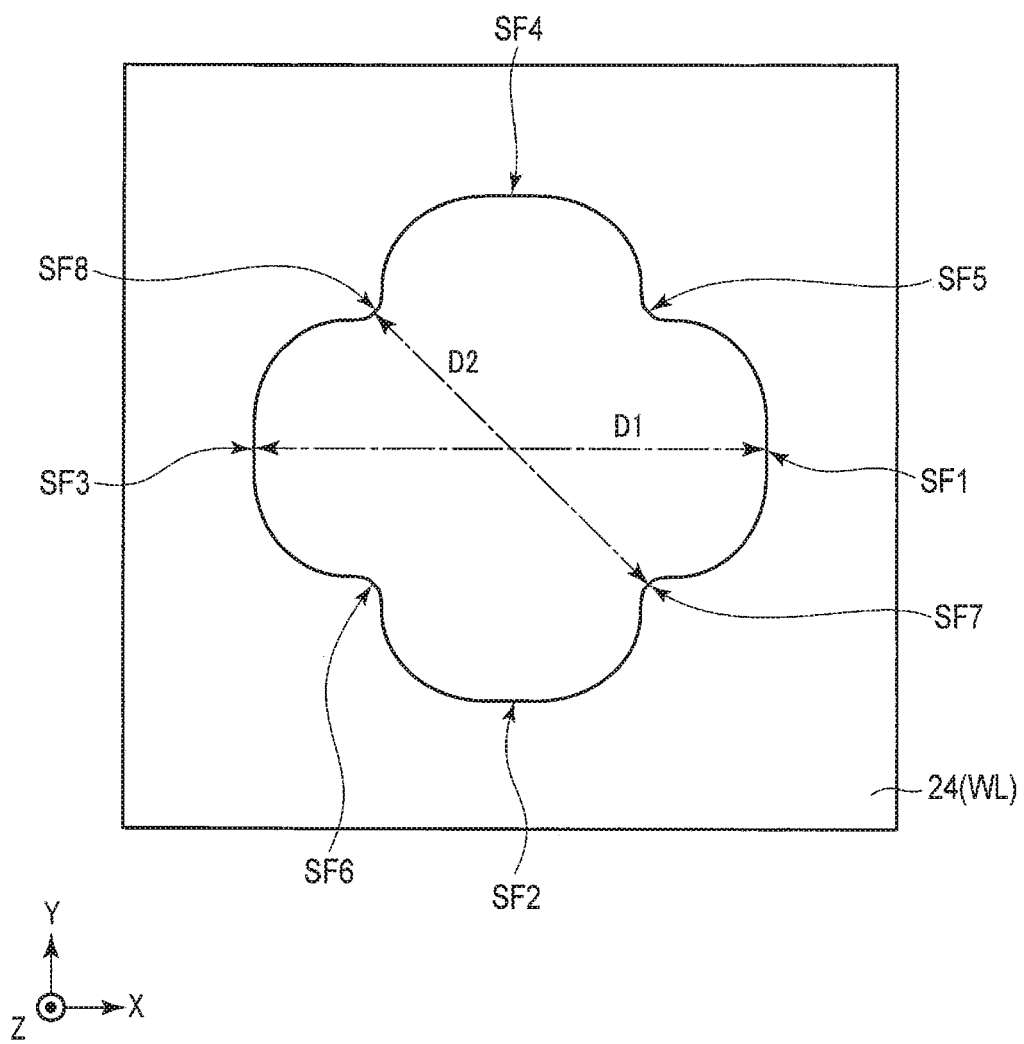
FIG. 6 is a plan view of the wiring layer 24 shown in FIG. 4.

FIG. 6 is a plan view of the wiring layer 24 shown in FIG. 4.

The first face SF1 and the third face SF3 are opposed to each other in the X direction. The second face SF2 and the fourth face SF4 are opposed to each other in the Y direction. The fourth face SF4 is located between the first face SF1 and the third face SF3, as viewed in the X direction, and is different in position from the first face SF1 and the third face SF3, as viewed in the +Y direction. The second face SF2 is located between the first face SF1 and the third face SF3, as viewed in the X direction, and is different in position from the first face SF1 and the third face SF3, as viewed in the −Y direction.

A fifth face SF5 is located between the first face SF1 and the fourth face SF4. The fifth face SF5 is continuous with the first face SF1 and the fourth face SF4 and is located in a direction between the +X direction and the +Y direction.

A sixth face SF6 is located between the second face SF2 and the third face SF3. The sixth face SF6 is continuous with the second face SF2 and the third face SF3 and is located in a direction between the −X direction and the −Y direction.

A seventh face SF7 is located between the first face SF1 and the second face SF2. The seventh face SF7 is continuous with the first face SF1 and the second face SF2 and is located in a direction between the +X direction and the −Y direction.

An eighth face SF8 is located between the third face SF3 and the fourth face SF4. The eighth face SF8 is continuous with the third face SF3 and the fourth face SF4 and is located in a direction between the −X direction and the +Y direction.

The first face SF1 to the eighth face SF8 are provided such that they pass through the same plane. Also, the first face SF1 to the eighth face SF8 are in the same layer.

The curvature changes from the first face SF1 toward the fifth face SF5. Further, the curvature changes from the fifth face SF5 toward the fourth face SF4. The first face SF1, the fourth face SF4 and the fifth face SF5 include a portion in which the curvature increases from the first face SF1 toward the fifth face SF5 and a portion in which the curvature decreases from the fifth face SF5 toward the fourth face SF4. The curvature is an amount representing a degree of curvature of a curve. F example, the curvature of a circumference of radius r is 1/r, and the radius of curvature is r. An increase in the curvature means that the radius of curvature decreases, and a decrease in the curvature means that the radius of curvature increases.

The curvature changes from the second face SF2 toward the sixth face SF6. Further, the curvature changes from the sixth face SF6 toward the third face SF3. The second face SF2, the sixth face SF6 and the third face SF3 include a portion in which the curvature increases from the second face SF2 toward the sixth face SF6 and a portion in which the curvature decreases from the sixth face SF6 toward the third face SF3.

The curvature changes from the first face SF1 toward the seventh face SF7. Further, the curvature changes from the seventh face SF7 toward the second face SF2. The first face SF1, the seventh face SF7 and the second face SF2 include a portion in which the curvature increases from the first face SF1 toward the seventh face SF7 and a portion in which the curvature decreases from the seventh face SF7 toward the second face SF2.

The curvature changes from the third face SF3 toward the eighth face SF8. Further, the curvature changes from the eighth face SF8 toward the fourth face SF4. The third face SF3, the eighth face SF8 and the fourth face SF4 include a portion in which the curvature increases from the third face SF3 toward the eighth face SF8 and a portion in which the curvature decreases from the eighth face SF8 toward the fourth face SF4.

The distance D1 between the first face SF1 and the third face SF3 is larger than the distance D2 between the fifth face SF5 and the sixth face SF6 and the distance between the seventh face SF7 and the eighth face SF8. Likewise, the distance between the second face SF2 and the fourth face SF4 is larger than the distance D2 between the fifth face SF5 and the sixth face SF6 and the distance between the seventh face SF7 and the eighth face SF8.

The first face SF1 is opposed to a first signal line 29-1. The second face SF2 is opposed to a second signal line 29-2. The third face SF3 is opposed to a third signal line 29-3. The fourth face SF4 is opposed to a fourth signal line 29-4. The first to fourth signal lines will be described later.

The first face SF1 includes a first portion having a concave curvature. The second face SF2 includes a second portion having a concave curvature. The third face SF3 includes a third portion having a concave curvature. The fourth face SF4 includes a fourth portion having a concave curvature.

The fifth face SF5 includes a fifth portion having a convex curvature. The sixth face SF6 includes a sixth portion having a convex curvature. The seventh face SF7 includes a seventh portion having a convex curvature. The eighth face SF8 includes an eighth portion having a convex curvature.

To explain in different words, the wiring layer 24 includes a first point SF1, a third point SF3 opposed to the first point SF1 in the X direction, a second point SF2 located between the first point SF1 and the third point SF3 in the X direction and being different in position from them, as viewed in the −Y direction, and a fourth point SF4 opposed to the second point SF2 in the +Y direction.

Assuming that a circle passing through the first point SF1, the second point SF2, the third point SF3 and the fourth point SF4 is drawn, the wiring layer 24 includes on the surface thereof: a seventh point SF7 toward which the distance to the circle increases between the first point SF1 and the second point SF2 and which is located inside the circle; a sixth point SF6 toward which the distance to the circle increase between the second paint SF2 and the third point SF3 and which is located inside the circle; an eighth point SF8 toward which the distance to the circle increases between the third point SF3 and the fourth point SF4 and which is located inside the circle; and a fifth point SF5 toward which the distance to the circuit increases between the fourth point SF4 and the first point SF1 and which is located inside the circle.

On the surface of the wiring layer 24, the distance to the circle is maximal at the midpoint between the first point SF1 and the second point. SF2 (namely, at the seventh point SF7), at the midpoint between the second point SF2 and the third point SF3 (namely, at the sixth point SF6), at the midpoint between the third point and the fourth point SF4 (namely, at the eighth point SF8) and at the midpoint between the fourth point SF4 and the first point SF1 (namely, at the fifth point SF5).

Four memory cell transistors MTa, MTb, MTc, and MTd are provided in the opening AH1 of the wiring layer 24.

Memory cell transistor MTa includes a block insulating film 25-1, a charge storage film (charge trap film) 26-1, a floating gate electrode 27-1, a tunnel insulating film 28-1, a semiconductor film (channel film) 29-1, and a cover film 30-1. The block insulating film 25-1 is provided on b the first face SF1 of the wiring layer 24. The charge storage film 26-1 is provided on a side face of the block insulating film 25-1. The floating gate electrode 27-1 is provided on a side face of the charge storage film 26-1. The tunnel insulating film 28-1 is provided on a side face of the floating gate electrode 27-1. The semiconductor film 29-1 is provided on a side face of the tunnel insulating film 28-1. The cover film 30-1 is provided on a side face of the semiconductor film 29-1. In this specification, the semiconductor film 29 is also referred to as a signal line. The charge storage film 26-1 and the floating gate electrode 27-1 each have a function of storing electric charge. The charge storage film 26-1 and the floating gate electrode 27-1 may be collectively referred to as a charge storage film. The semiconductor film 29-1 is a region where the channel of memory cell transistor MTa is formed. The cover film 30-1 is a member required in the manufacturing process to be described later.

The block insulating film 25-1 is formed of silicon oxide, for example. The charge storage film 26-1 is an insulating film formed of, for example, silicon nitride (SiN) or a metal oxide (e.g., hafnium oxide). The floating gate electrode 27-1 is formed of polycrystalline silicon, for example. The tunnel insulating film 28-1 is formed of silicon oxide, for example. The semiconductor film 29-1 is formed of polycrystalline silicon, for example. The cover film 30-1 is formed of, for example, silicon nitride (SiN) or silicon oxide.

Memory cell transistor MTb is provided on the second face SF2 of the wiring layer 24 and includes a block insulating film 25-2, a charge storage film 26-2, a floating gate electrode 27-2, a tunnel insulating film 28-2, a semiconductor film 29-2, and a cover film 30-2. Memory cell transistor MTc is provided on the third face SF3 of the wiring layer 24 and includes a block insulating film 25-3, a charge storage film 26-3, a floating gate electrode 27-3, a tunnel insulating film 28-3, a semiconductor film 29-3, and a cover film 30-3. Memory cell transistor MTd is provided on the fourth face SF4 of the wiring layer 24 and includes a block insulating film 25-4, a charge storage film 26-4, a floating gate electrode 27-4, a tunnel insulating film 28-4, a semiconductor film 29-4, and a cover film 30-4. The configurations of memory cell transistors MTb to MTd are similar to the configuration of memory cell transistor MTa. Also, the configurations of select transistors ST1 and ST2 are similar to the configuration of memory cell transistor MTa.

In this specification, where members denoted by reference numbers with branch numbers (e.g., "25-1" to "25-4") do not have to be distinguished, they will be denoted by reference numbers without branch numbers, and the description given of the reference numerals without the branch numbers is applicable to the reference numerals with the branch numbers.

The block insulating films 25-1 to 25-4 are formed, for example, of a film that is continuous in an XY plane. The charge storage film 26 and the floating gate electrode 27 are provided for each memory cell transistor. MT. That is, the charge storage film 26 and the floating gate electrode 27 are separated in the Z direction, for each memory cell transistor MT. The tunnel insulating film 28 extends in the Z direction and is provided in common to the NAND string NS. The semiconductor film 29 extends in the Z direction and is provided in common to the NAND string NS. The cover film 30 extends in the Z direction and is provided in common to the NAND string NS.

As shown in FIG. 5, each of the interlayer insulating layers 23 is provided with a cross-shaped opening AH2. The size of opening AH2 is smaller than that of opening AH1.

Tunnel insulating film 28-1 is provided in the concave portion recessed in the +X direction of the interlayer insulating layer 23. Semiconductor film 29-1 is provided on the side face of tunnel insulating film 28-1. Cover film 30-1 is provided on the side face of semiconductor film 29-1.

Tunnel insulating film 28-2 is provided in the concave portion recessed in the −Y direction of the interlayer insulating layer 23. Semiconductor film 29-2 is provided on the side face of tunnel insulating film 8-2. Cover film 3-2 provided on the side face of semiconductor film 29-2.

Tunnel insulating film 28-3 is provided in the concave portion recessed in the −X direction of the interlayer insulating layer 23. Semiconductor film 29-3 is provided on the side face of tunnel insulating film 28-3. Cover film 30-3 is provided on the side face of semiconductor film 3.

Tunnel insulating film 28-4 is provided in the concave portion recessed in the +Y direction of the interlayer insulating layer 23. Semiconductor film 29-4 is provided on the side face of tunnel insulating film 28-4. Cover film 30-4 is provided on the side face of semiconductor film 29-4.

As shown in FIG. 3, the semiconductor films 29-1 to 29-4 are connected together at their lower end portions, and are in contact with, and electrically connected to, the conductive layer 22 serving as source line SL. The gaps of openings AH1 and AH2 are filled with a core layer 31. The core layer 31 is formed of silicon oxide, for example.

An insulating layer 32 is provided on the uppermost interlayer insulating layer 23 and the core layer 31. The insulating layer 32 is formed of silicon oxide, for example.

A plurality of bit lines BL are provided on the insulating layer 32. The bit lines BL are electrically connected to the semiconductor films 29 via a contact plug 33. Bit lines BL are formed of tungsten (W), for example.

Figure 7:
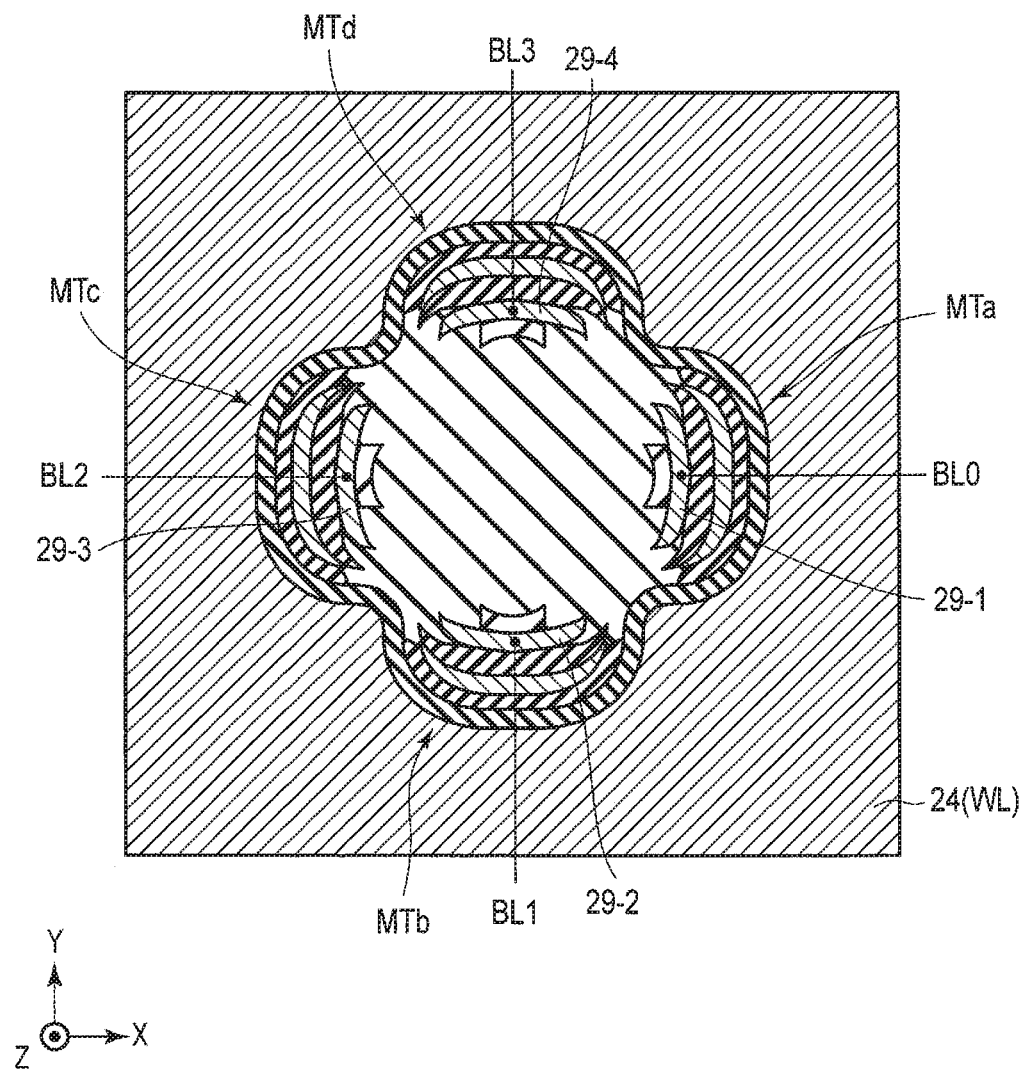
FIG. 7 is a view illustrating an example of the connection relationship between a semiconductor film and a bit line.

FIG. 7 is a view illustrating an example of the connection relationship between the semiconductor films 29 and the bit lines BL. Semiconductor films 29-1 to 29-4 are electrically connected to bit lines BL0 to BL3, respectively. The connection relationship between the semiconductor films 29 and the bit lines BL can be optionally designed. In addition, the physical arrangement of the bit lines BL can be optionally designed.

In the manner described above, four NAND strings NS arranged in opening AH1 (and opening AH2) which is formed in a laminated film are formed. Openings AH1 are arranged either in a lattice pattern or in a staggered fashion (zigzag fashion), so that a plurality of NAND strings NS are arranged.

[2] Manufacturing Method of Memory Cell Array 10

Figure 8:
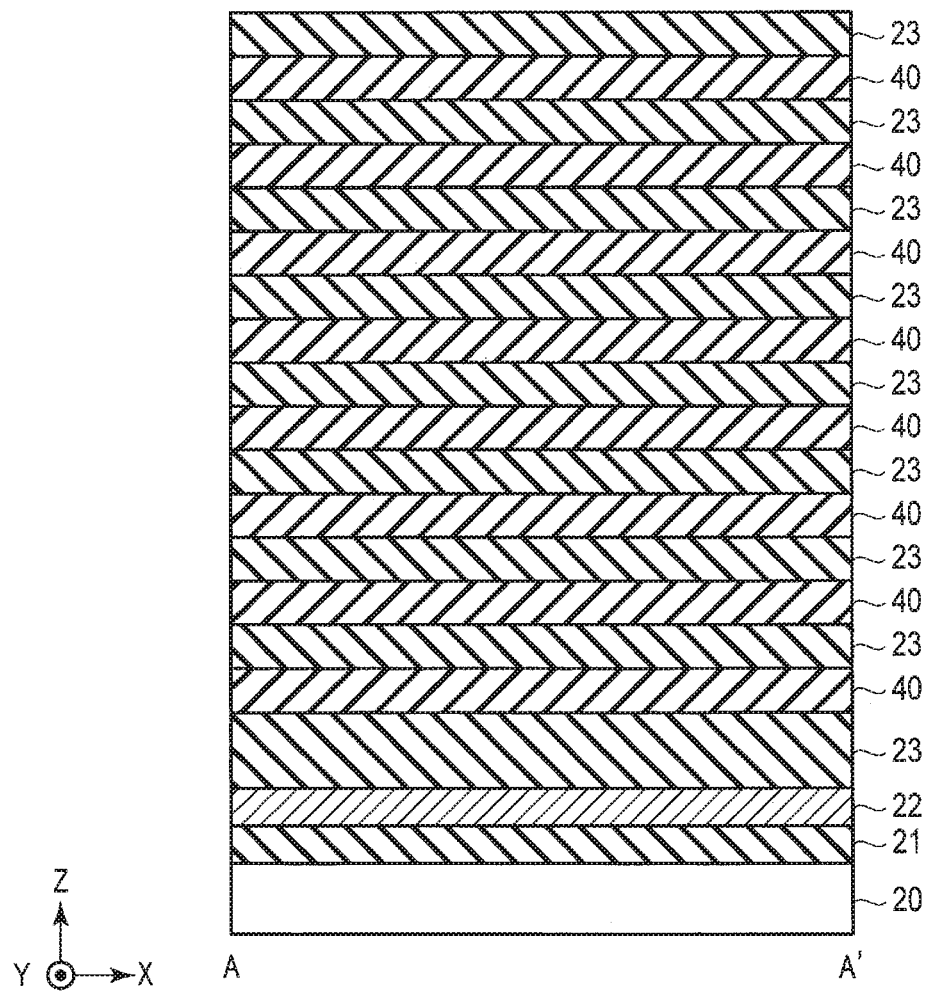
FIG. 8 is a sectional view illustrating a method of manufacturing a memory cell array.

Next, a method of manufacturing the memory cell array 10 will be described. FIGS. 8 to 27 are plan views and sectional views illustrating a method of manufacturing the memory cell array 10. FIGS. 8, 10, and 27 are sectional views taken along line A-A' of FIG. 4.

First of all, a silicon substrate 20 is prepared. Subsequently, as shown in FIG. B, an insulating layer 21 and a conductive layer 22 (source line SL) are formed in this order on the silicon substrate 20. The conductive layer 22 may be a laminated film in which a plurality of conductive layers are stacked. For example, the conductive layer 22 may be a laminated film in which a conductive layer formed of polycrystalline silicon, a metal layer formed of, for example, tungsten (W) and a conductive layer formed of polycrystalline silicon are stacked in this order.

Subsequently, a plurality of interlayer insulating layers 23 and a plurality of sacrifice layers 40 are alternately stacked on the conductive layer 22, for example, by the CVD (chemical vapor deposition) method, thereby forming a laminated film. An interlayer insulating layer 23 is disposed on the lowermost layer of the laminated film and on the uppermost layer of the laminated film. The interlayer insulating layers 23 are formed of silicon oxide, for example. The sacrifice layers 40 are formed of, for example, silicon nitride (SiN). The sacrifice layers 40 may be formed of any material as long as it provides a sufficient wet etching selection ratio with respect to the interlayer insulating layers 23, and silicon oxynitride (SiON) or the like may be used.

Figure 9:
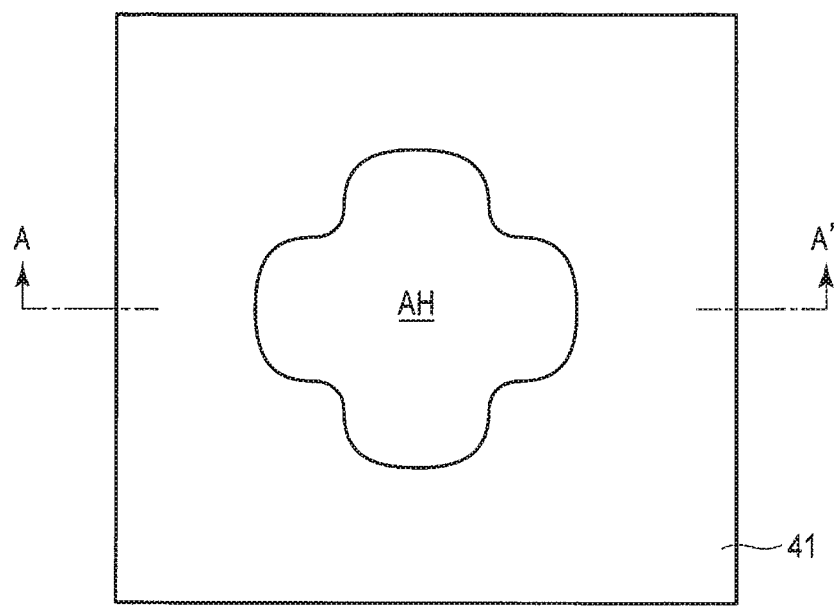
FIG. 9 is a plan view illustrating the method of manufacturing the memory cell array and shows a state after FIG. 8.
Figure 11:
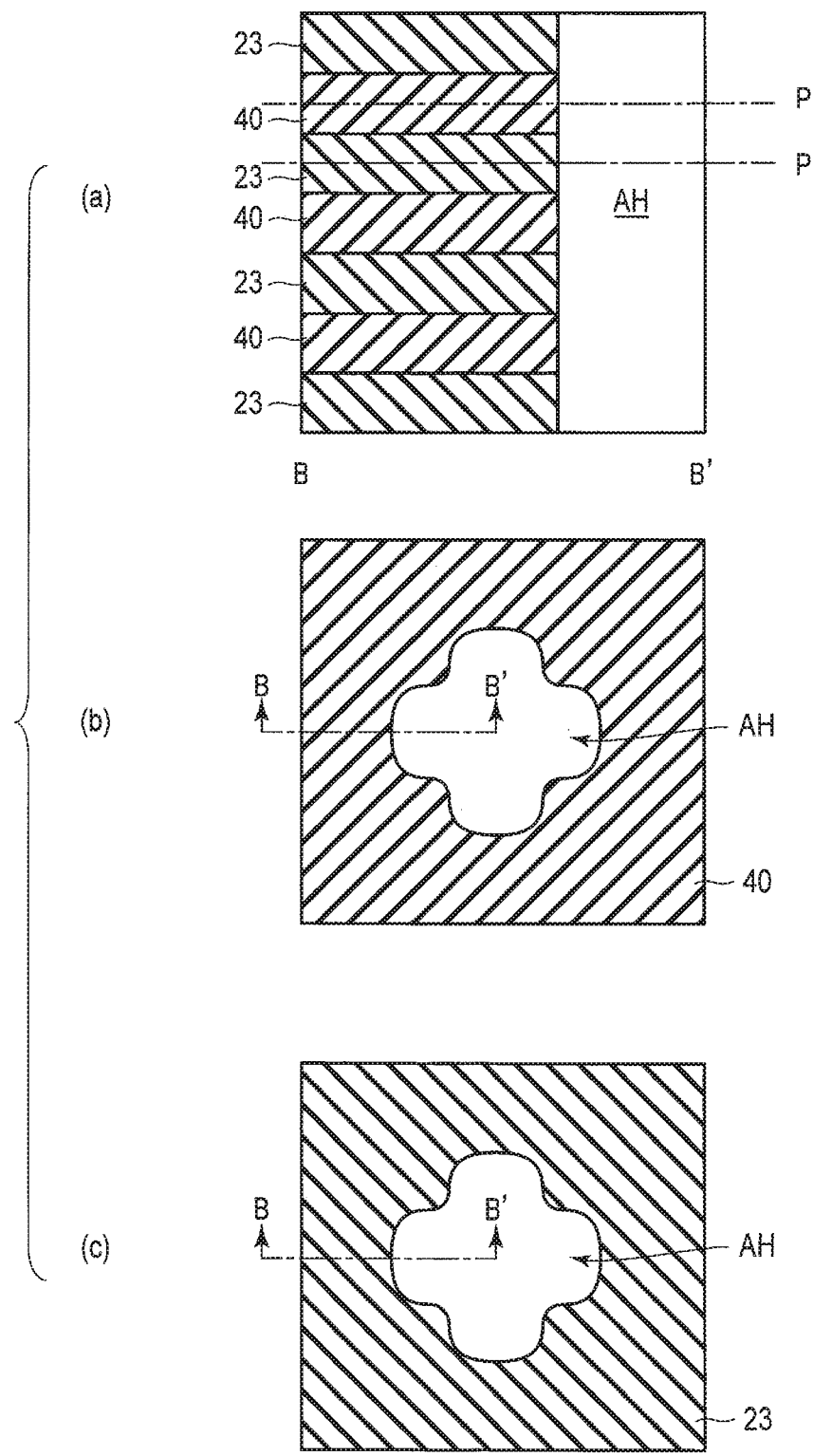
FIG. 11 is a view illustrating the method of manufacturing the memory cell array and shows a state after FIG. 10.

Subsequently, as shown in FIG. 9 and FIG. 10, a mask layer 41 is formed on the laminated film by lithography so as to expose a region where a cross-shaped opening (memory hole) AH is to be formed. Subsequently, with the mask layer 41 as a mask, a cross-shaped opening AH is formed in the laminated film by anisotropic etching such as RIE (reactive ion etching). The opening AH exposes the conductive layer 22.

Hereinafter, the manufacturing method will be described, mainly with reference to the sectional view of the region AH shown in FIG. 10. FIG. 11(a) is a sectional view of the region AH shown in FIG. 10. FIG. 11(b) is a plan view illustrating how the memory cell array 10 is at position P1 shown in FIG. 11(a). FIG. 11(c) is a plan view illustrating how the memory cell array 10 is at position P2 shown in FIG. 11(a). That is, FIG. 11(a) is a sectional view taken along line B-B' shown in FIGS. 11(b) and 11(c).

Subsequently, as shown in FIG. 12, the sacrifice layers 40 are isotropically etched through the opening AH. The isotropic etching is, for example, wet etching that uses phosphoric acid ($H_3PO_4$) as an etchant. As a result, the exposed faces of the sacrifice layers 40 facing the opening AH are recessed (the sacrifice layers 40 are recessed), and recessed portions are formed on the side faces of the opening AH.

Figure 13:
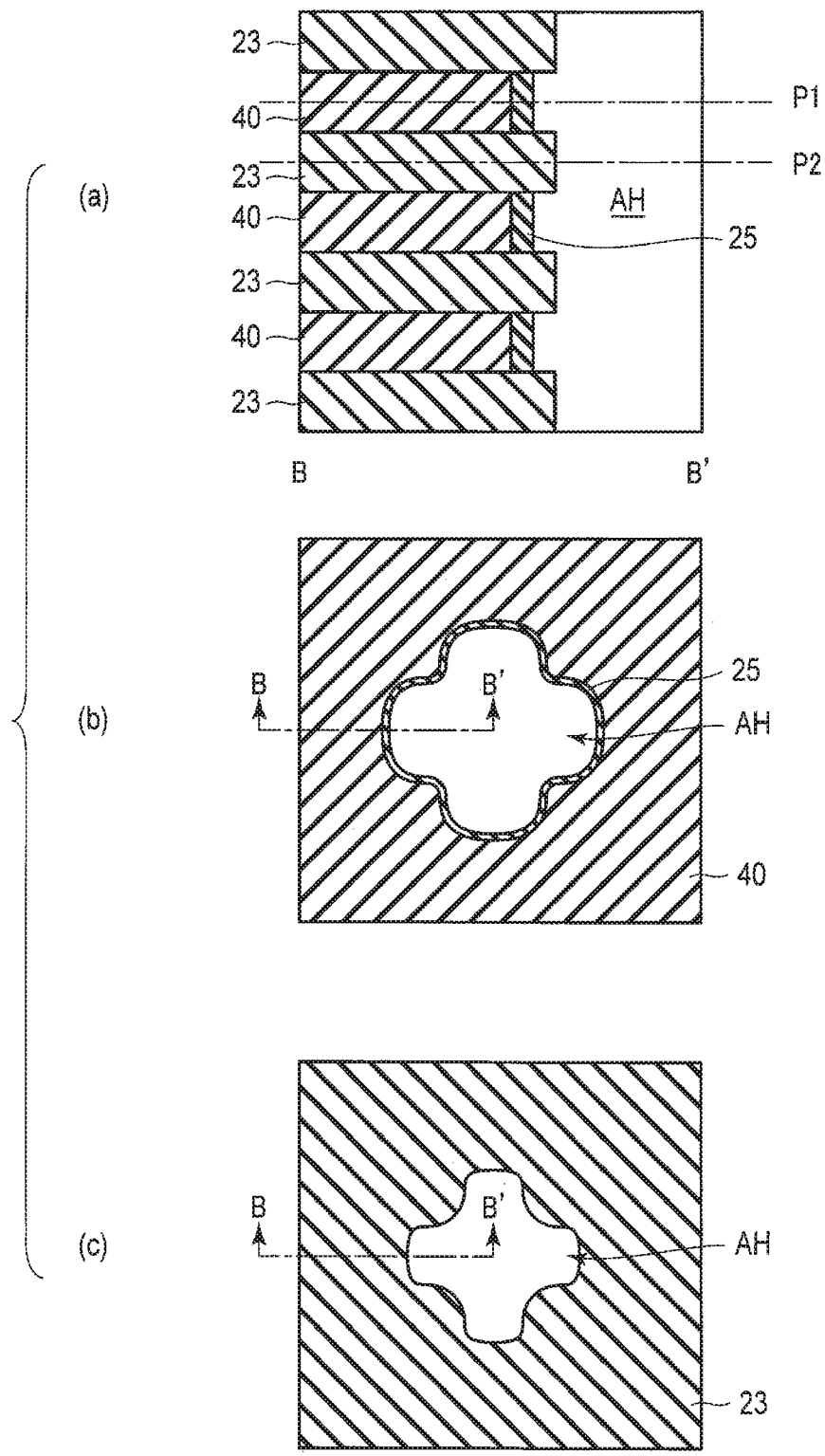
FIG. 13 is a view illustrating the method of manufacturing the memory cell array and shows a state after FIG. 12.

Subsequently, as shown in FIG. 13, silicon oxide films 25 are formed on the side faces of the sacrifice layers 40. The silicon oxide films are formed, for example, by oxidizing the side faces of the sacrifice layers 40. As a result, a block insulating film 25 is formed on the side face of each sacrifice layer 40.

Figure 14:
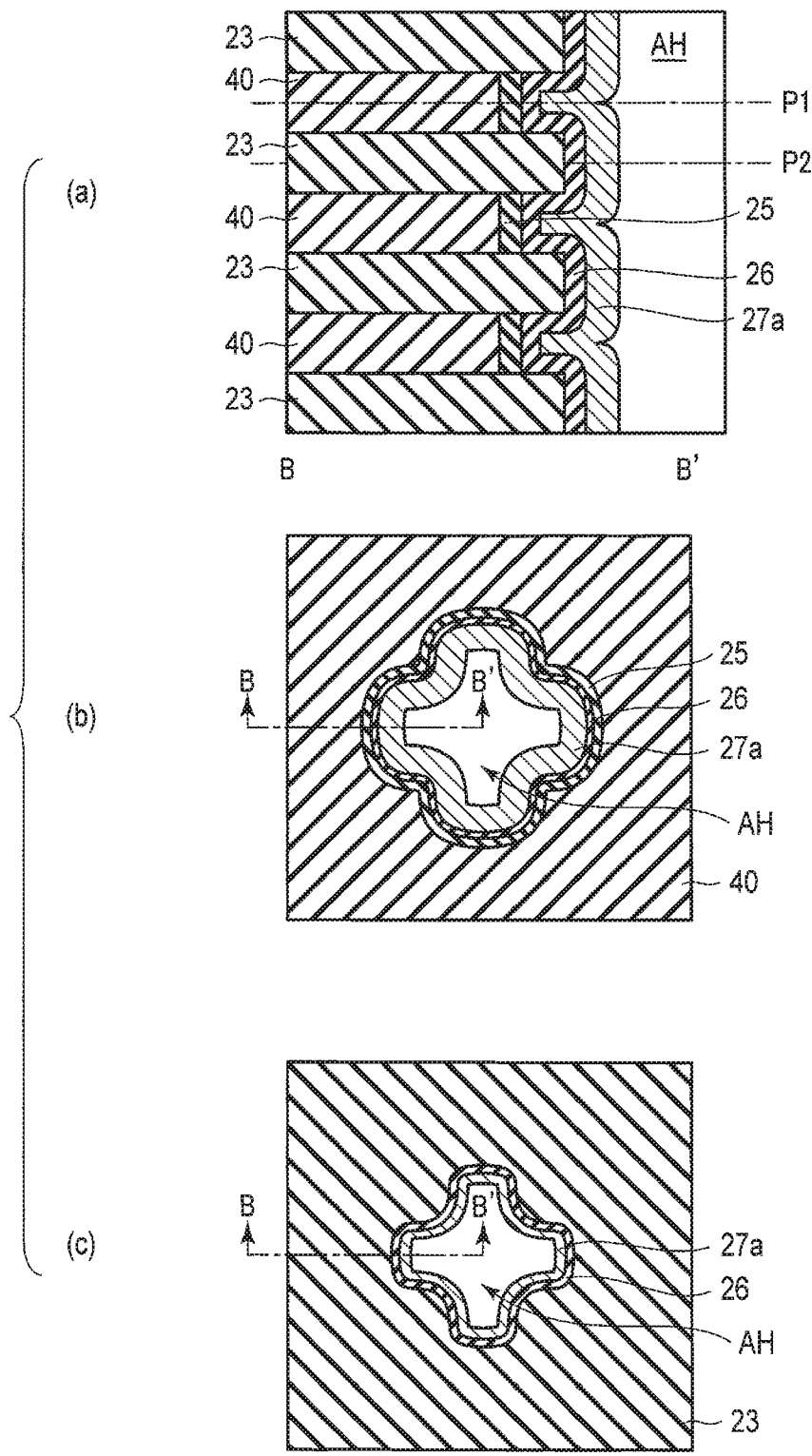
FIG. 14 is a view illustrating the method of manufacturing the memory cell array and shows a state after FIG. 13.

Subsequently, as shown in FIG. 14, a charge storage film 26 is formed on the side face of the opening AH, for example, by the CVD method. The charge storage film 26 is formed of, for example, silicon nitride (SiN) or a metal oxide (e.g., hafnium oxide). Subsequently, polycrystalline silicon film 27a is formed on the side face of the charge storage film 26, for example, by the CVD method. As a result, the concave portions formed in the sacrifice layers 40 are filled with the charge storage film 26 and polycrystalline silicon film 27a.

Figure 15:
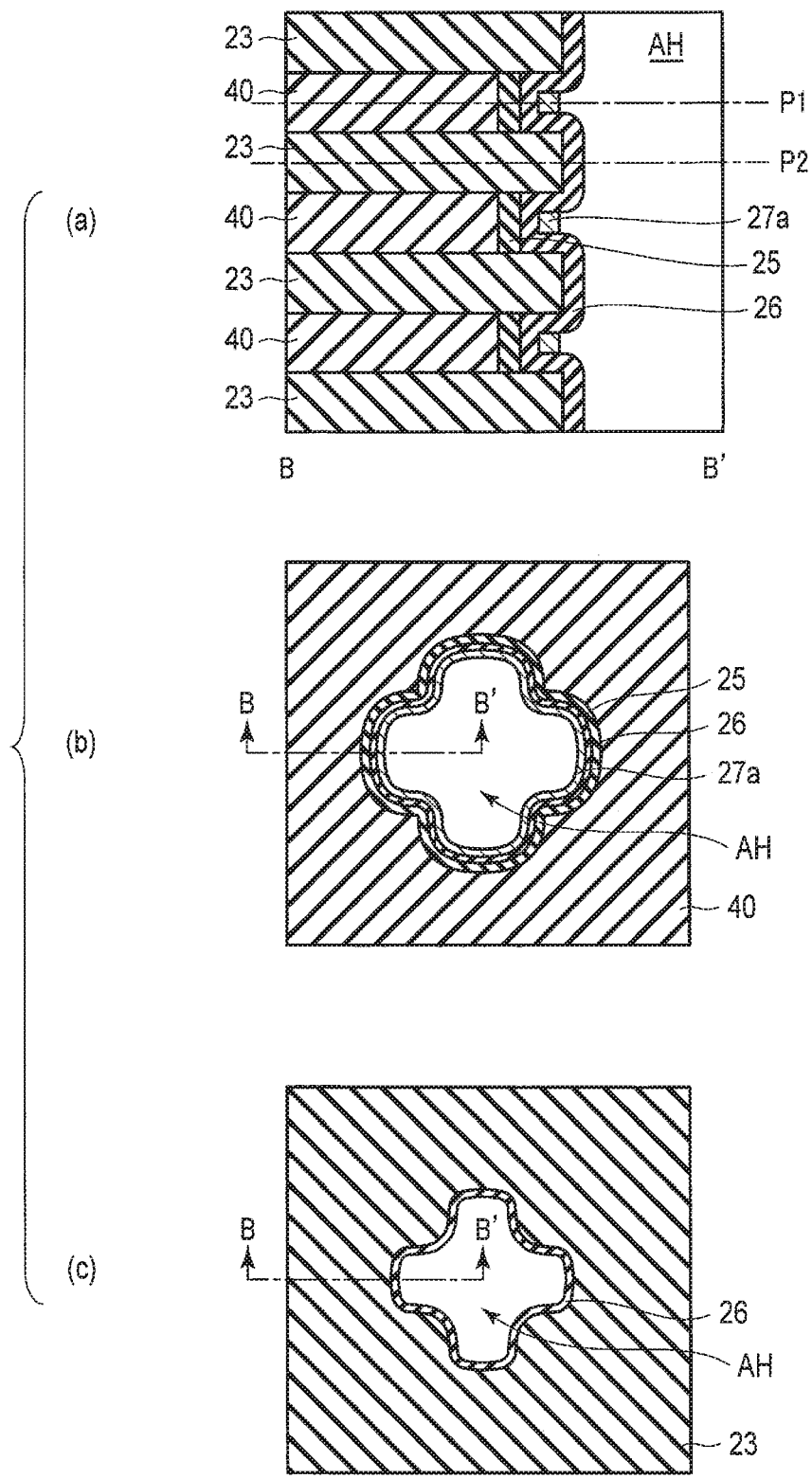
FIG. 15 is a view illustrating the method of manufacturing the memory cell array and shows a state after FIG. 14.

Subsequently, as shown in FIG. 15, polycrystalline silicon film 27a is etched back by isotropic etching. Thereby, polycrystalline silicon film 27a is divided for each sacrifice layer 40. That is, polycrystalline silicon film 27a is not provided in the plan view (FIG. 15(c)) corresponding to position P2.

Figure 16:
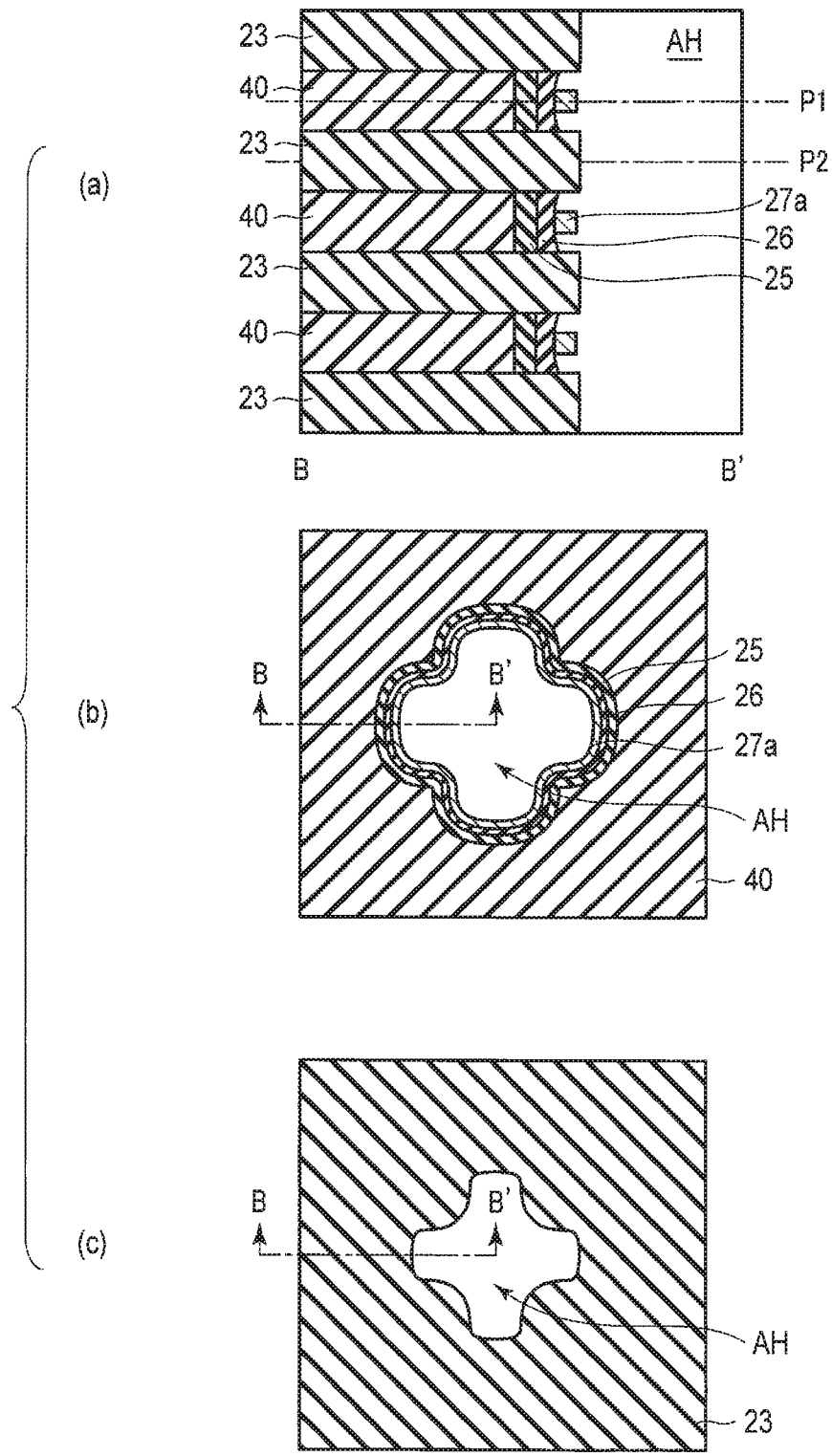
FIG. 16 is a view illustrating the method of manufacturing the memory cell array and shows a state after FIG. 15.

Subsequently, as shown in FIG. 16, the charge storage film 26 is etched back by isotropic etching. Thereby, the charge storage film 26 is divided for each sacrifice layer 40. That is, the charge storage film 26 is not provided in the plan view (FIG. 16 (c)) corresponding to position P2.

Figure 17:
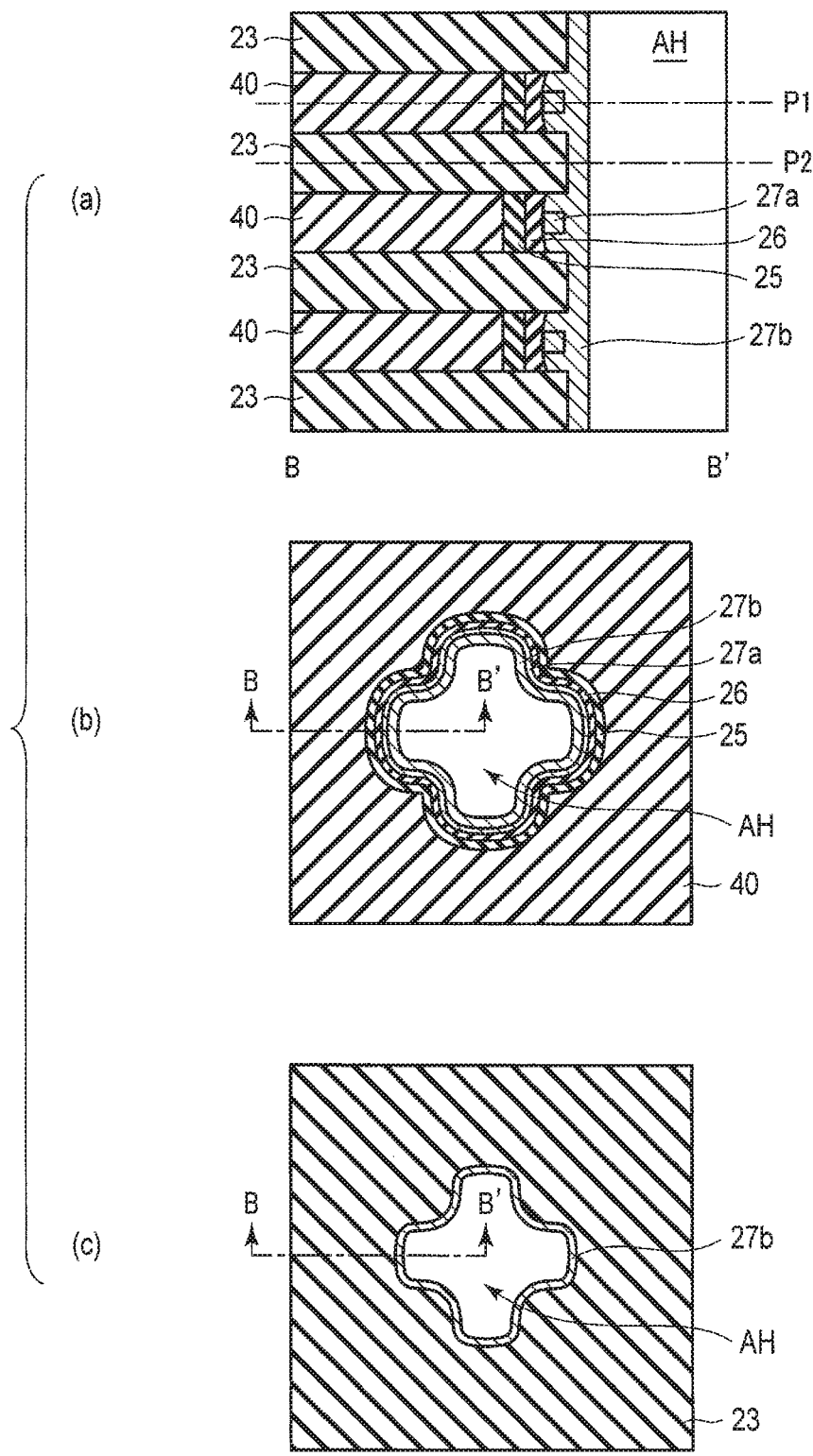
FIG. 17 is a view illustrating the method of manufacturing the memory cell array and shows a state after FIG. 16.

Subsequently, as shown in FIG. 17, polycrystalline silicon film 27b is formed again on the side face of the opening AH, for example, by the CVD method. As a result, the gaps above and under polycrystalline silicon films 27a are filled with polycrystalline silicon film 27b.

Figure 18:
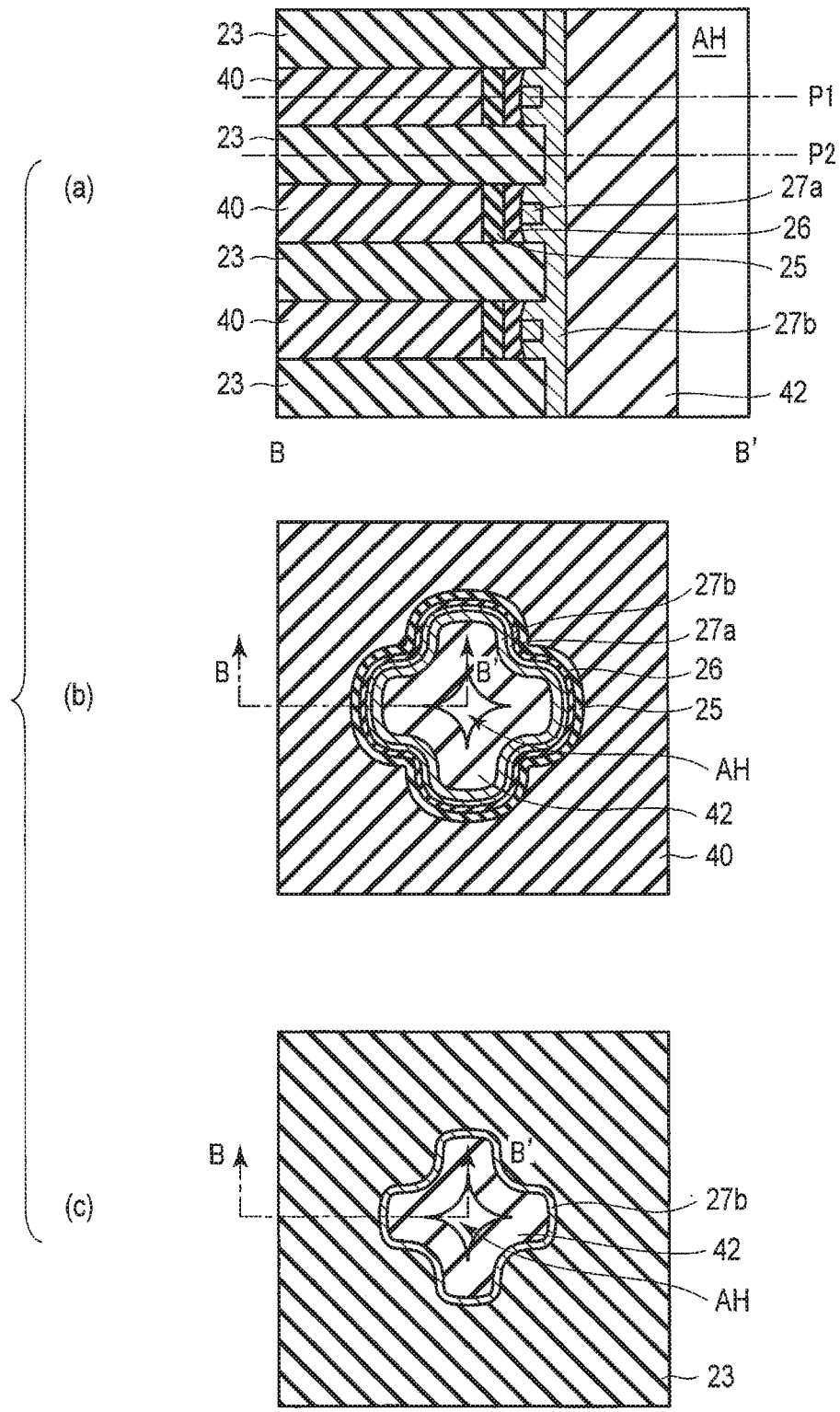
FIG. 18 is a view illustrating the method of manufacturing the memory cell array and shows a state after FIG. 17.

Subsequently, as shown in FIG. 18, a cover film 42 is formed on the side face of the opening AH, for example, by the CVD method. The cover film 42 is an insulating film formed of, for example, silicon nitride (SiN) or silicon oxide.

Figure 19:
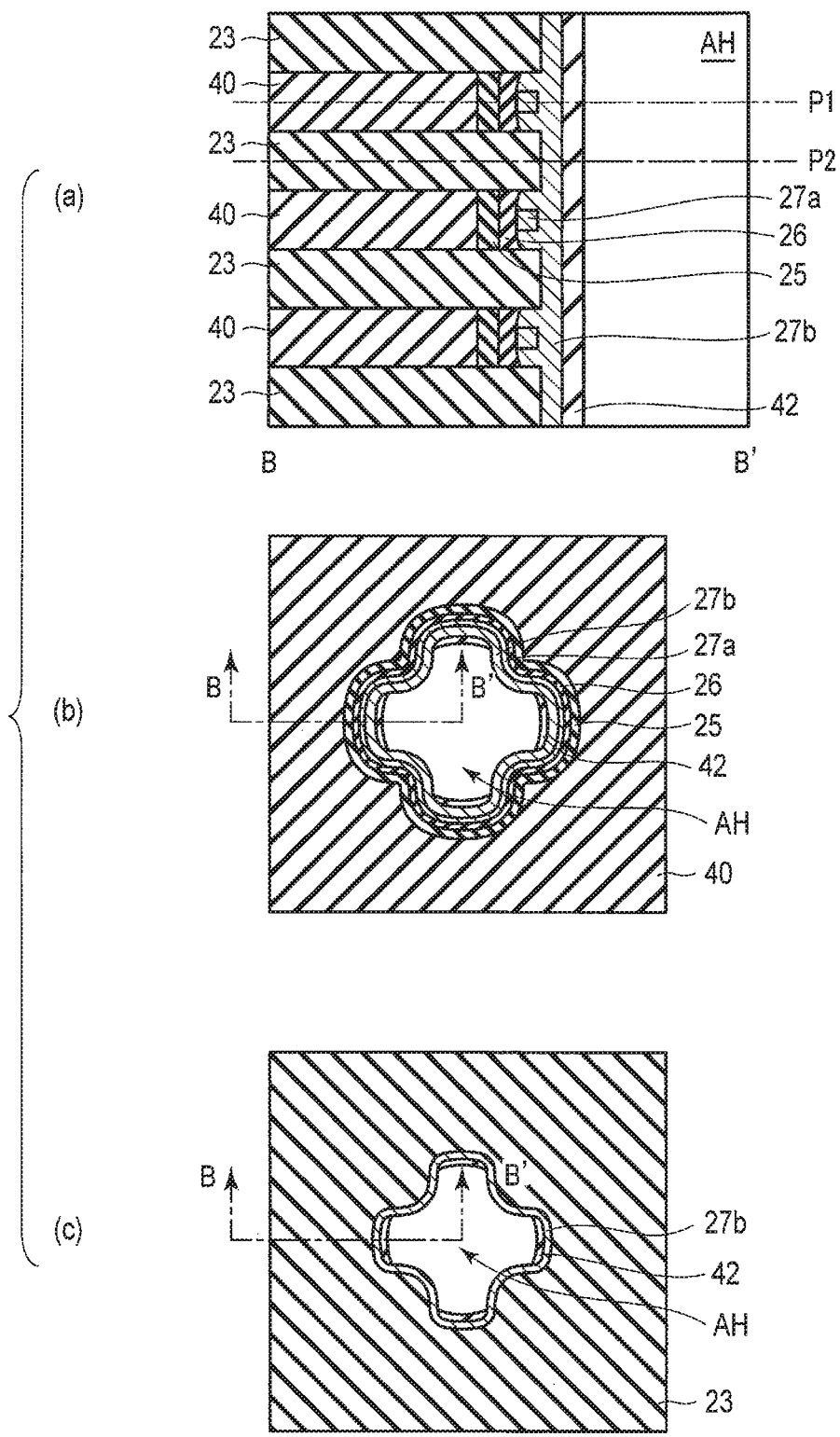
FIG. 19 is a view illustrating the method of manufacturing the memory cell array and shows a state after FIG. 18.

Subsequently, as shown in FIG. 19, the cover film 42 is etched back by isotropic etching such that the cover film 42 is divided for each convex portion of the cross-shaped opening AH. As a result, the cover film 42 remains on each of the four convex portions of the cross-shaped opening AH. Polycrystalline silicon film 27b is exposed in the concave portion between the two adjacent, convex portions.

Figure 20:
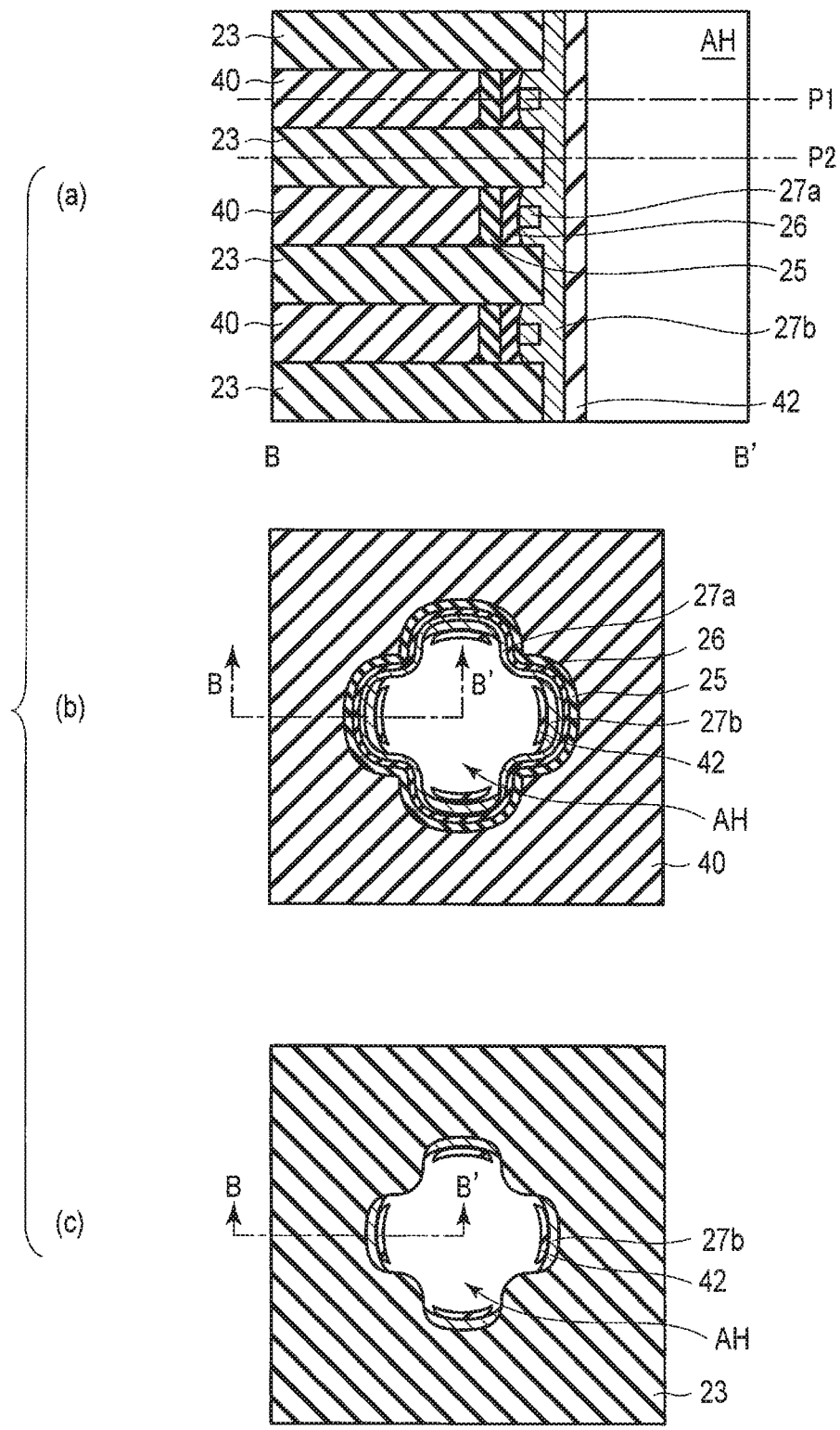
FIG. 20 is a view illustrating the method of manufacturing the memory cell array and shows a state after FIG. 19.

Subsequently, as shown in FIG. 20, polycrystalline silicon film 27b is etched back by isotropic etching such that polycrystalline silicon film 27b is divided for each convex portion of the opening AH. In the etch-back step shown in FIG. 20, the cover film 42 is present on the convex portions of the opening AH, so that polycrystalline silicon film 27b formed on the convex portions of the opening AH remains without being etched.

Figure 21:
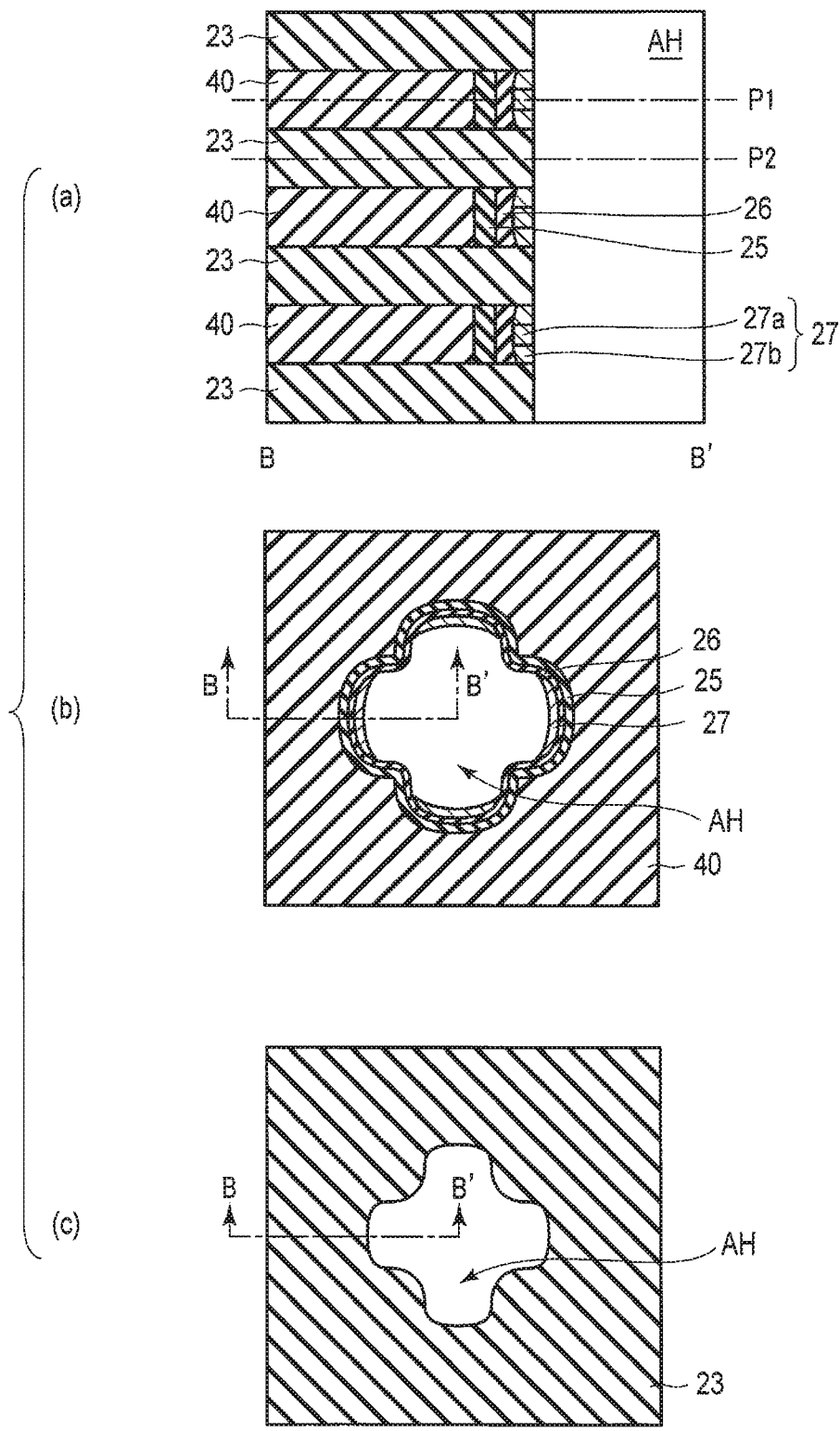
FIG. 21 is a view illustrating the method of manufacturing the memory cell array and shows a state after FIG. 20.

Subsequently, as shown in FIG. 21, the cover film 42 is removed. Subsequently, polycrystalline silicon film 27b is etched back by isotropic etching. Thereby, polycrystalline silicon film 27b is divided for each sacrifice layer 40. That is, in the opening AH, the interlayer insulating layers 23 are exposed in addition, a floating gate electrode 27 is formed by polycrystalline silicon films 27a and 27b.

Figure 22:
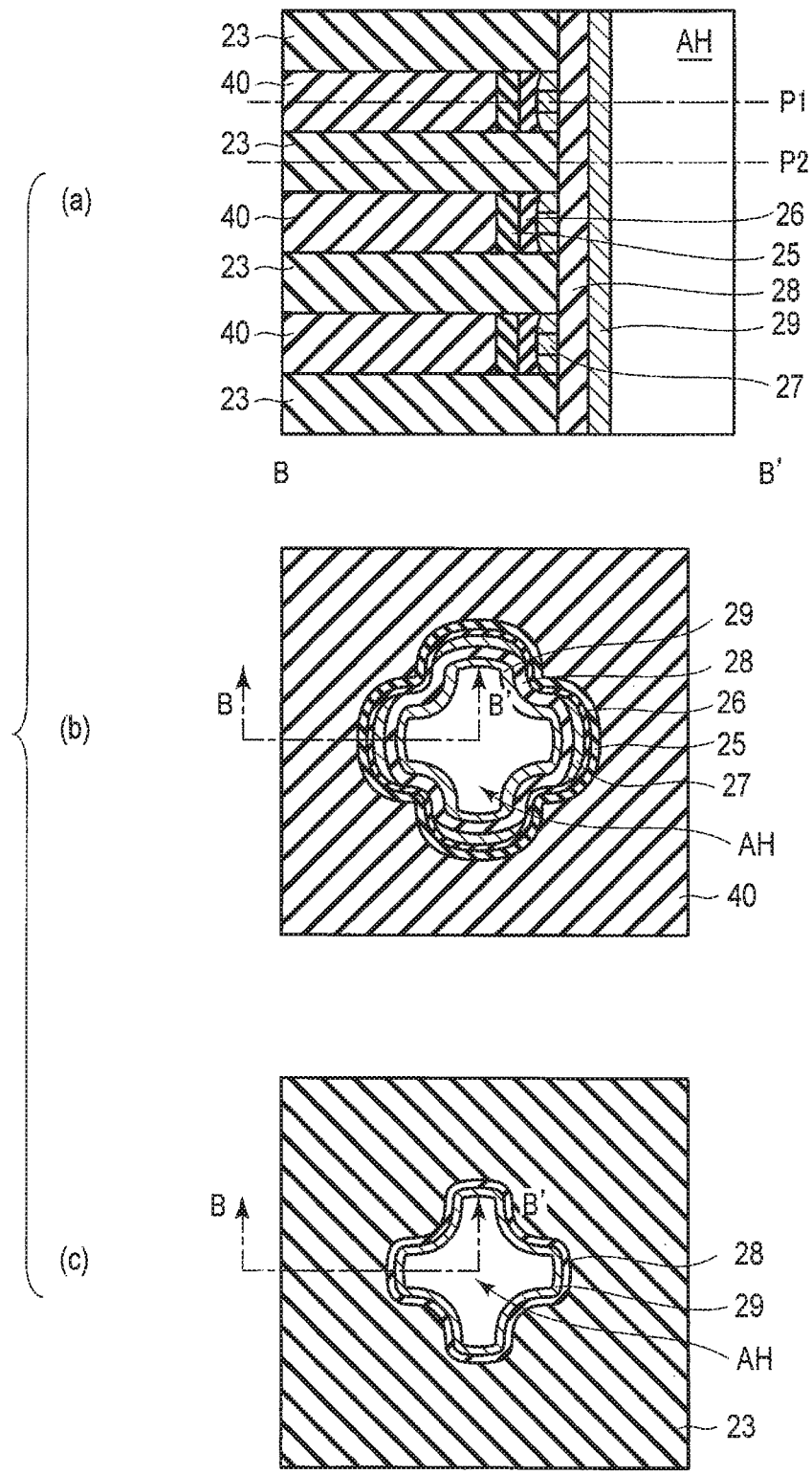
FIG. 22 is a view illustrating the method of manufacturing the memory cell array and shows a state after FIG. 21.

Subsequently, as shown in FIG. 22, for example, a silicon oxide film is formed on the side face of the opening AH, for example, by the CVD method. As a result, a tunnel insulating film 28 in contact with the floating gate electrode 27 is formed. Subsequently, although not shown, the silicon oxide film formed on the conductive layer 22 is removed.

Subsequently, a semiconductor film 29 is formed on the side face of the tunnel insulating film 28, for example, by the CVD method. The semiconductor film 29 is a polycrystalline silicon film. The semiconductor film 29 is formed on the conductive layer 22 as well.

Figure 23:
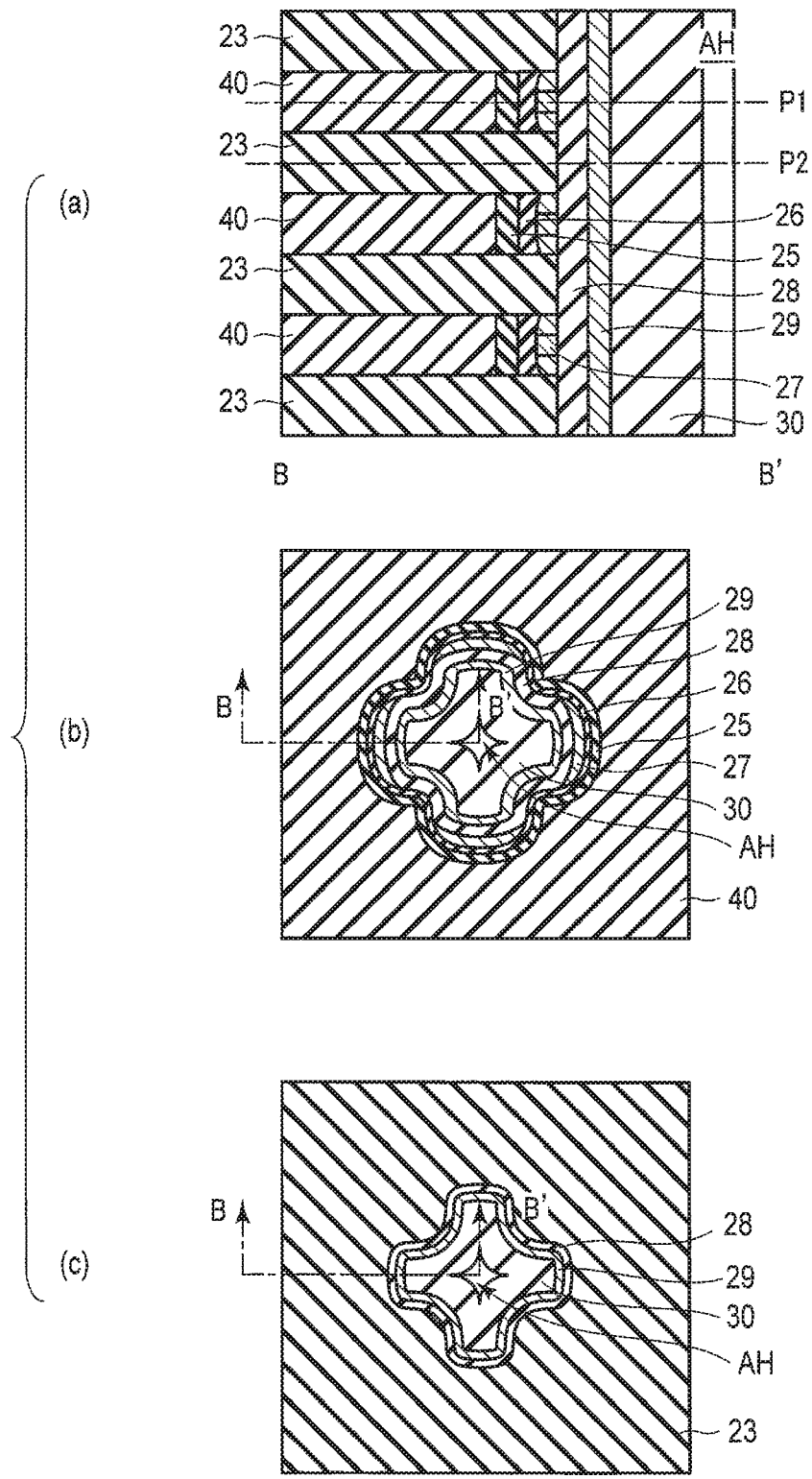
FIG. 23 is a view illustrating the method of manufacturing the memory cell array and shows a state after FIG. 22.

Subsequently, as shown in FIG. 23, a cover film 30 is formed on the side face of the semiconductor film 29, for example, by the CVD method. The cover film 30 is an insulating film formed of, for example, silicon nitride (SiN) or silicon oxide.

Figure 24:
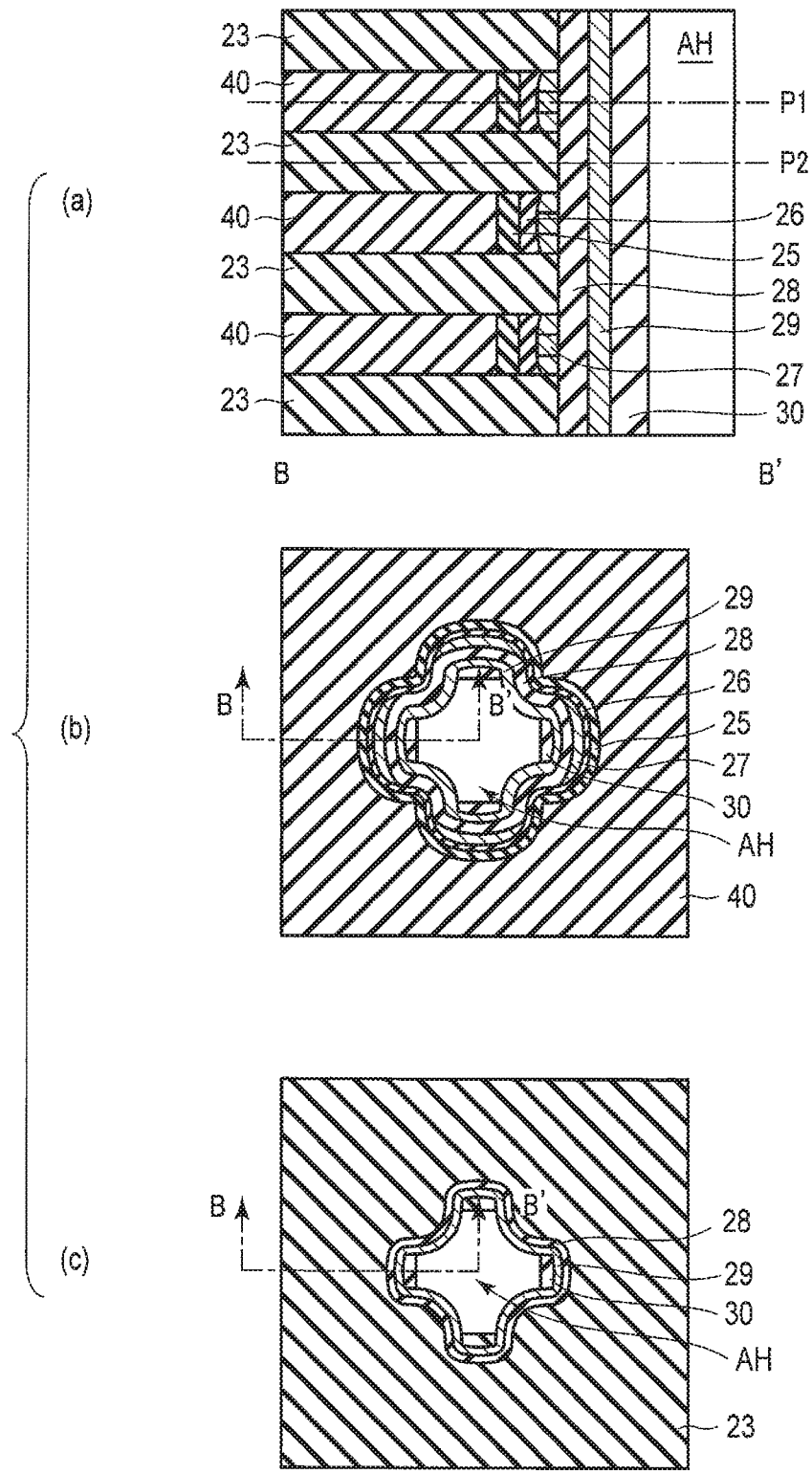
FIG. 24 is a view illustrating the method of manufacturing the memory cell array and shows a state after FIG. 23.

Subsequently, as shown in FIG. 24, the cover film 30 is etched back by isotropic etching such that the cover film 30 is divided for each convex portion of the opening AH. As a result, the cover film 30 remains on each of the four convex portions of the opening AH. The semiconductor film 29 is exposed in the concave portion between the two adjacent convex portions.

Figure 25:
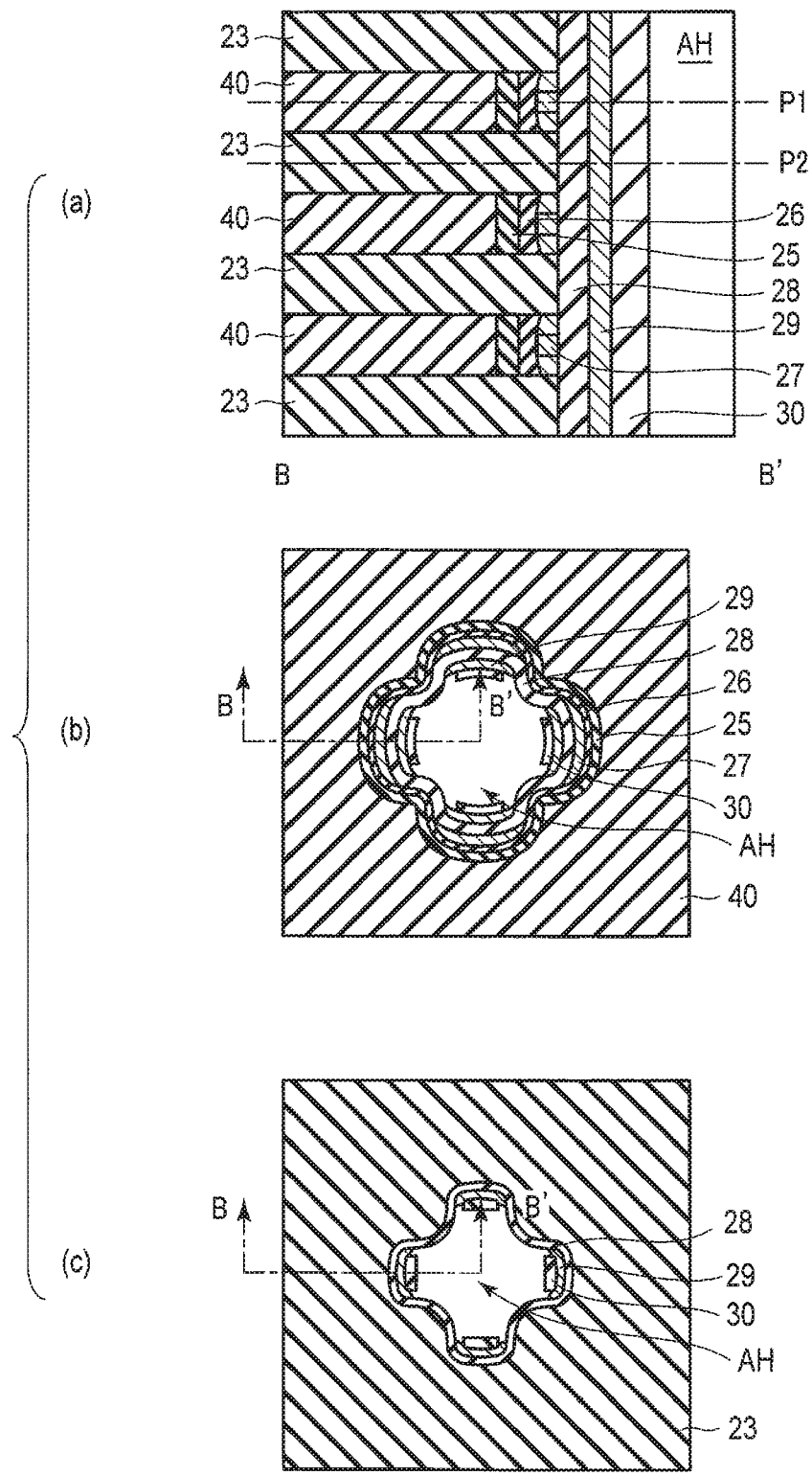
FIG. 25 is a view illustrating the method of manufacturing the memory cell array and shows a state after FIG. 24.

Subsequently, as shown in FIG. 25, the semiconductor film 29 is etched back by isotropic etching such that the semiconductor film 29 is divided for each convex portion of the opening AH. In the etch-back step shown in FIG. 25, the cover film 30 is present on the convex portions of the opening AH, so that the semiconductor film 29 formed on the convex portions of the opening AH remains without being etched.

Figure 26:
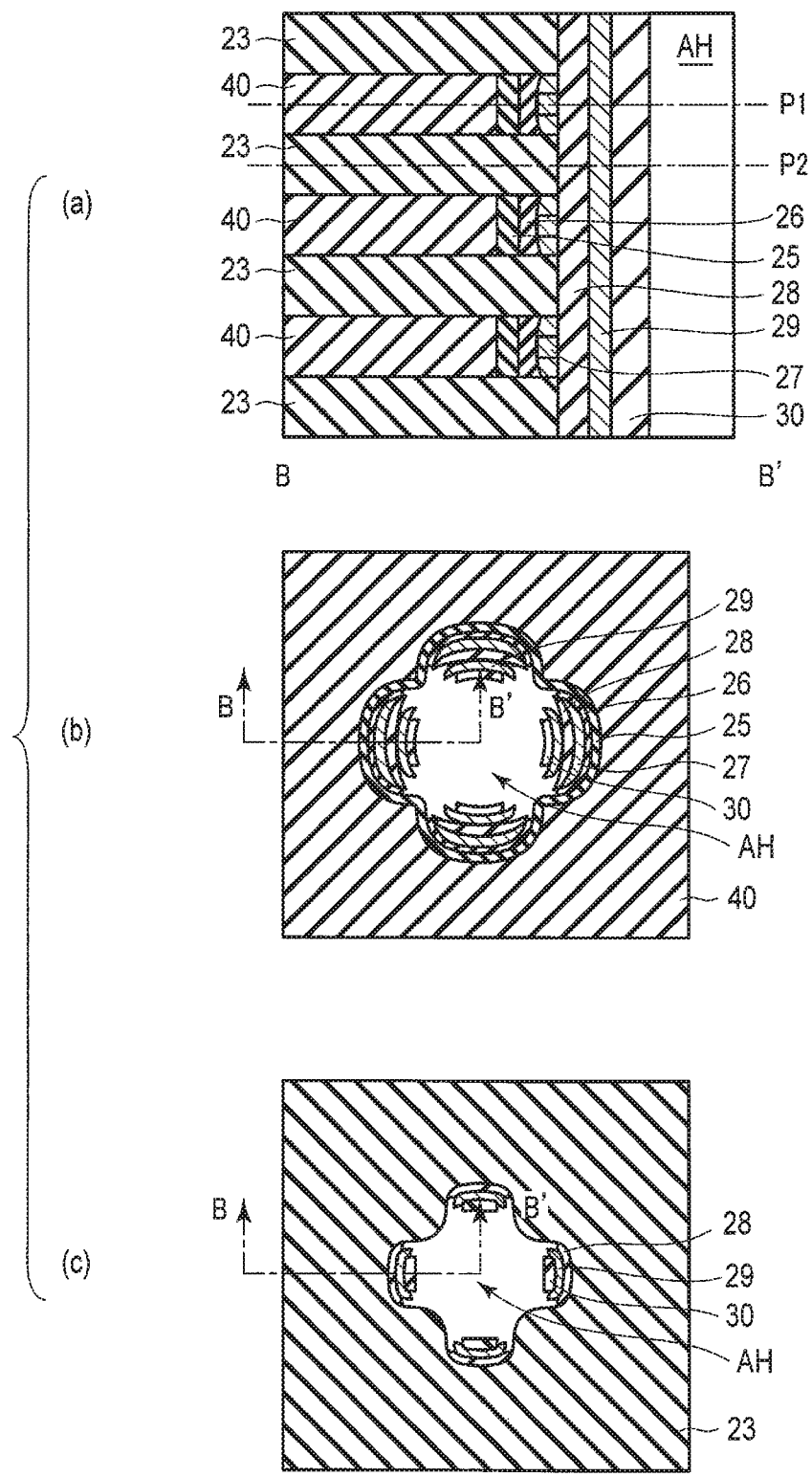
FIG. 26 is a view illustrating the method of manufacturing the memory cell array and shows a state after FIG. 25.
Figure 27:
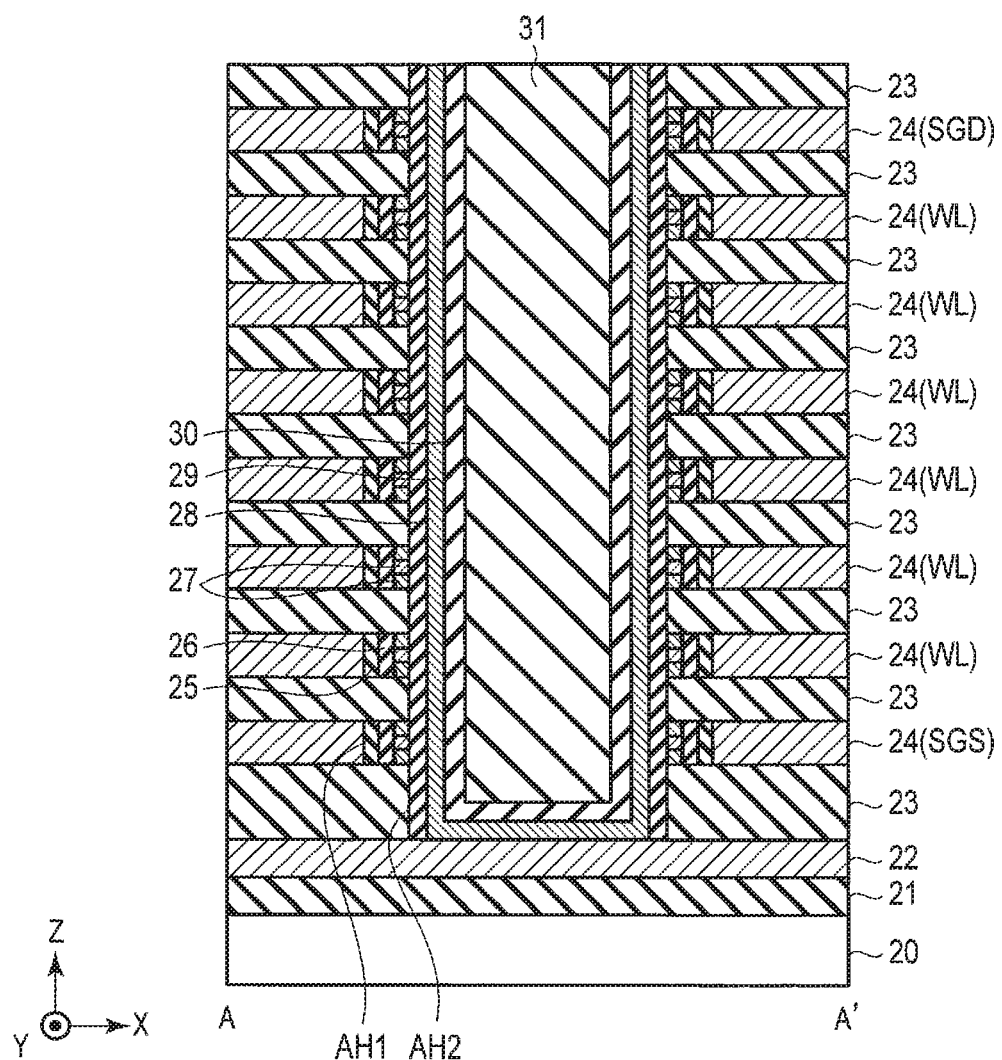
FIG. 27 is a sectional view illustrating the method of manufacturing the memory cell array and shows a state after FIG. 26.

Subsequently, as shown in FIG. 26, the tunnel insulating film 28 is etched back by isotropic etching such that the tunnel insulating film 28 is divided for each convex portion of the opening AH. The cover film 30 is present on the convex portions of the opening AH, so that the tunnel insulating film 28 formed on the convex portions of the opening AH remains without being etched.

Subsequently, the charge storage film 26 is etched back by isotropic etching such that the charge storage film 26 is divided for each convex portion of the opening AH. The cover film 30 is present on the convex portions of the opening AH, so that the charge storage film 26 formed on the convex portions of the opening AH remains without being etched.

Subsequently, as shown in FIG. 27, silicon oxide is filled in the gaps of the openings AH (AH1 and AH2), for example, by the CVD method. As a result, a core layer 31 is formed in the center of the opening AH. Subsequently, residual films formed on the uppermost interlayer insulating layer 23 are removed, for example, by CMP (chemical mechanical polishing), and the uppermost interlayer insulating layer 23 and the core layer 31 are planarized.

Subsequently, the sacrifice layers 40 are replaced with a plurality of wiring layers 24 (word lines WL, and select gate lines SGS and SGD). Specifically, the sacrifice layers 40 are removed by performing wet etching using phosphoric acid ($H_3PO_4$) as an etchant, via the regions where the side faces of the sacrifice layers 40 are exposed or via the opening. As a result, the block insulating film 25 is exposed in the recesses in which the sacrifice layers 40 were formed.

Subsequently, a wiring layer 24 is formed on the side face of the block insulating film 25, for example, by the CVD method, such that the wiring layer 24 fills the recesses in which the sacrifice layers 40 were formed. For example, the wiring layer 24 includes a main body part (tungsten (W) or the like) and a barrier metal film (titanium nitride (TiN) or the like) covering the upper face, the side face, and the bottom face of the main body part.

Subsequently, as shown in FIGS. 3 to 5, an insulating layer 32 formed of, for example, silicon oxide is formed on the uppermost interlayer insulating layer 23 and the core layer 31, for example, by the CVD method. Subsequently, a contact plug 33 to be electrically connected to the semiconductor film 29 is formed on the semiconductor film 29 and in the insulating layer 32. Subsequently, a bit line BL to be electrically connected to the contact plug 33 is formed on the contact plug 33 and the insulating layer 32.

In the manner mentioned above, a memory cell array according to the present embodiment is formed.

[3] Advantages of Embodiment

As detailed above, the semiconductor memory device 1 according to the present embodiment includes a plurality of wiring layers 24 (word line WL, select gate line SGD, and select gate line SGS) provided above the substrate 20, with a plurality of interlayer insulating layers 23 interposed. Each of the wiring layers 24 is provided with a cross-shaped opening AH. That is, the wiring layer 24 includes a first face SF1 recessed in the first direction parallel to the surface of the substrate 20, a second face SF2 parallel to the surface of the substrate 20 and recessed in the second direction different from the first direction, a third face SF3 parallel to the surface of the substrate 20 and recessed in a third direction different from the first and second directions, and a fourth face SF4 parallel to the surface of the substrate 20 and recessed in a fourth direction different from the first to third directions. Memory cell transistors MTa, MTb, MTc and MTd are provided on the first to fourth faces SF1 to SF4 of the wiring layer 24, respectively. Each memory cell transistor MT includes a block insulating film 25, a charge storage film 26 provided on a side face of the block insulating film 25, a floating gate electrode 27 provided on a side face of the charge storage film 25, a tunnel insulating film 28 provided on a side face of the floating gate electrode 27, and a semiconductor film 29 provided on a side face of the tunnel insulating film 28.

According to the present embodiment, therefore, four memory cell transistors MT can be arranged in the same plane of one opening AH. With this configuration, it is possible to provide a semiconductor memory device that can be highly integrated.

In addition, the combination of isotropic film formation and isotropic etching (wet etching, or CDE (chemical dry etching)) enables cell division without using high aspect processing.

According to the present embodiment, it is possible to provide a highly reliable semiconductor memory device and a manufacturing method thereof.

[4] Other Embodiments

Figure 28:
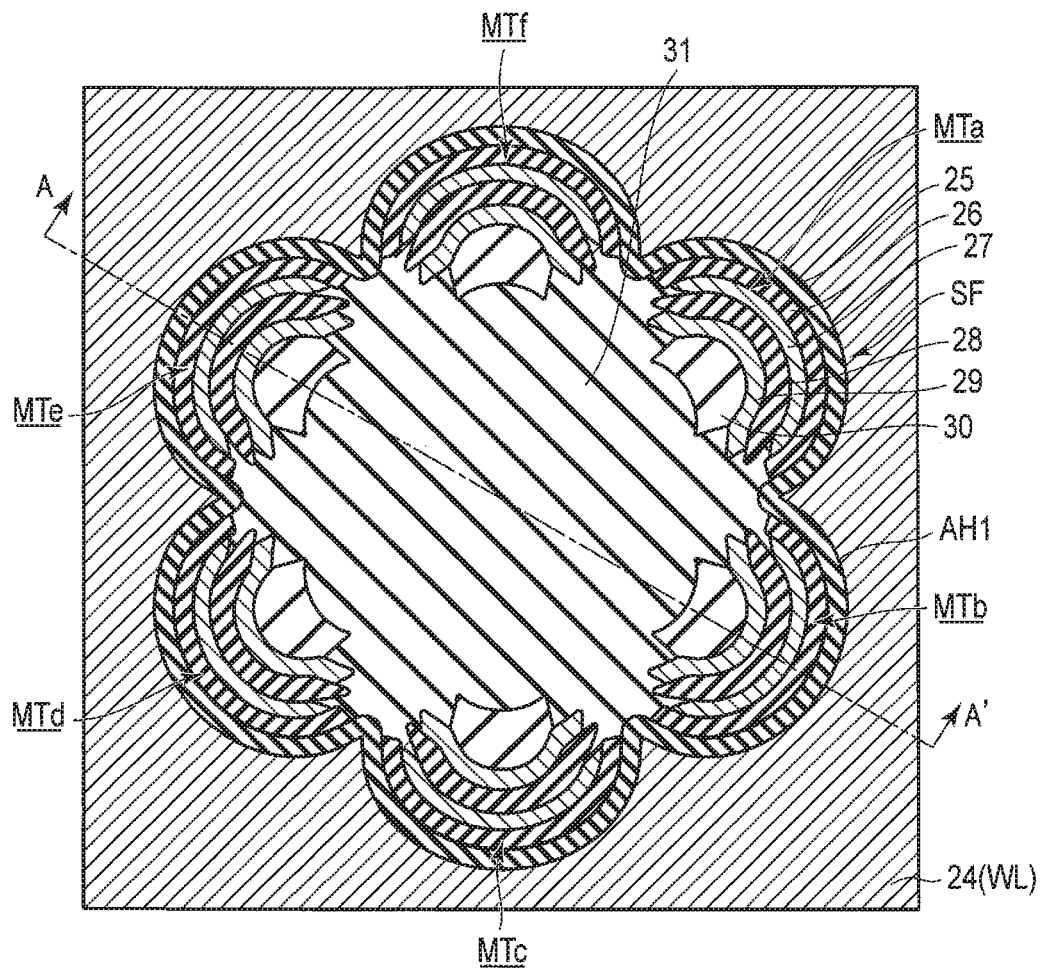
FIG. 28 is a plan view of a memory cell array according to another embodiment.

FIG. 28 is a plan view of a memory cell array 10 according to another embodiment. The sectional view of the memory cell array 10 is similar to that shown in FIG. 3 FIG. 28 is a plan view corresponding to position P1 shown in FIG. 3.

Each of wiring layers 24 is provided with an opening AH1. The opening AH1 has a hexagon-like shape (a six-petal shape) having six protrusions. Specifically, the wiring layer 24 has six curved faces SF recessed outward from the center of the opening AH1. Six memory cell transistors MTa to MTf are provided on the six curved faces SF of the wiring layer 24, respectively. Each memory cell transistor MT includes a block insulating film 25, a charge storage film 26, a floating gate electrode 27, a tunnel insulating film 28, a semiconductor film (channel film) 29, and a cover film 30.

In this manner, six memory cell transistors MT may be provided in the same level layer of the hexagon-like opening AH1.

Figure 29:
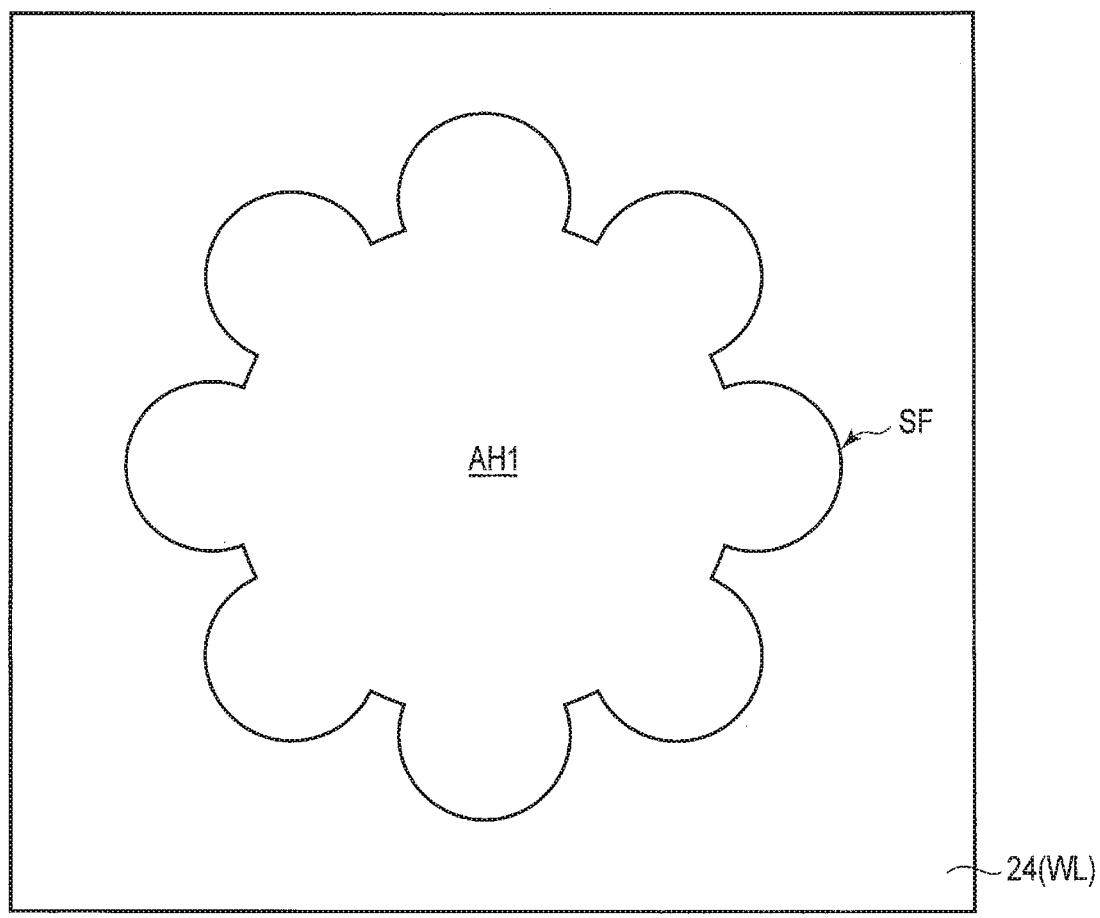
FIG. 29 is a plan view illustrating an opening of the memory cell array according to still another embodiment.

Further, as shown in FIG. 29, the opening AH1 formed in the wiring layer 24 may have an octagon-like shape (an eight-petal shape) having eight protrusions. Specifically, the wiring layer 24 has eight curved faces SF recessed outward from the center of the opening AH1. In this embodiment, eight memory cell transistors MT are provided in the same level layer of the opening AH1.

The number of convex portions the opening has is not limited to 4, 6, or 8, but can be optionally determined as long as it is 3 or more. Likewise, the number of memory cell transistors arranged in the same level layer is not limited to 4, 6, or 8, but can be optionally determined as long as it is 3 or more.

[5] Modifications

In connection with the above embodiments, reference was made to an FG (floating gate) type memory cell transistor that uses a conductive layer as a charge storage layer. However, a MONOS (metal-oxide-nitride-oxide-silicon) type may be used instead. In the MONOS type memory cell transistor, a charge storage film 26 formed of an insulating material is provided between a block insulating film 25 and a tunnel insulating film 28, and a floating gate electrode 27 is not employed.

The FG type memory cell transistor may have a configuration in which a floating gate electrode 27 is provided between a block insulating film 25 and a tunnel insulating film 28, and a charge storage film 26 is not employed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a wiring layer including:
 a first face;
 a second face opposed to the first face in a first direction;
 a third face provided between the first face and the second face in the first direction and being different in position from the first face and the second face in a second direction intersecting with the first direction;
 a fourth face opposed to the third face in the second direction;
 a fifth face continuously connected between the first face and the third face and located in a third direction which is between the first direction and the second direction;
 a sixth face opposed to the fifth face in the third direction and continuously connected between the second face and the fourth face;
 a seventh face continuously connected between the first face and the fourth face and located in a fourth direction which is between the first direction and the second direction and which is different from the third direction; and
 an eighth face opposed to the seventh face in the fourth direction and continuously connected between the second face and the third face;
a first insulating layer provided between the first to eighth faces;
a first signal line provided between the first face and the first insulating layer and extending in a direction perpendicular to the substrate;
a second signal line provided between the second face and the first insulating layer and extending in the direction perpendicular to the substrate;
a third signal line provided between the third face and the first insulating layer and extending in the direction perpendicular to the substrate;
a fourth signal line provided between the fourth face and the first insulating layer and extending in the direction perpendicular to the substrate;
a first memory cell provided between the first signal line and the wiring layer and configured to store first information;
a second memory cell provided between the second signal line and the wiring layer and configured to store second information;
a third memory cell provided between the third signal line and the wiring layer and configured to store third information; and
a fourth memory cell provided between the fourth signal line and the wiring layer and configured to store fourth information,
wherein the first direction, the second direction, the third direction, and the fourth direction are parallel to the substrate.

2. The device according to claim 1, wherein the first memory cell includes a second insulating layer provided between the first face and the first signal line, a charge storage film provided between the second insulating layer and the first signal line, and a third insulating layer provided between the charge storage film and the first signal line.

3. The device according to claim 1, wherein
in a section passing through the first memory cell to the fourth memory cell,
 a distance between the first face and the second face is larger than a distance between the fifth face and the sixth face and a distance between the seventh face and the eighth face, and
 a distance between the third face and the fourth face is larger than a distance between the fifth face and the sixth face and a distance between the seventh face and the eighth face.

4. The device according to claim 1, wherein the first face to the eighth face pass through one plane.

5. The device according to claim 1, wherein
in a plane passing through the first face to the eighth face, curvatures of the first face, the fifth face, and the third face change such that the curvatures increase from the first face toward the fifth face and decrease from the fifth face toward the third face.

6. A semiconductor memory device comprising:
a wiring layer comprising a surface including:

a first point;

a second point opposed to the first point in a first direction;

a third point provided between the first point and the second point in the first direction and being different in position from the first point and the second point in a second direction intersecting with the first direction;

a fourth point opposed to the third point in the second direction; and a fifth point which is provided within a circle passing through the first point, the second point, the third point and the fourth point, and toward which a distance to the circle increases between the first point and the third point;

a first insulating layer;

a first signal line provided between the first insulating layer and the first point and extending in a third direction intersecting with the first direction and the second direction;

a second signal line provided between the first insulating layer and the second point and extending in the third direction;

a third signal line provided between the first insulating layer and the third point and extending in the third direction;

a fourth signal line provided between the first insulating layer and the fourth point and extending in the third direction;

a first memory cell provided between the first signal line and the wiring layer and configured to store first information;

a second memory cell provided between the second signal line and the wiring layer and configured to store second information;

a third memory cell provided between the third signal line and the wiring layer and configured to store third information; and a fourth memory cell provided between the fourth signal line and the wiring layer and configured to store fourth information, wherein the surface including the first point, the second point, the third point, the fourth point, and the fifth point is continuous.

7. The device according to claim 6, wherein on the surface of the wiring layer, the distance to the circle is maximum at a midpoint between the first point and the third point.

8. The device according to claim 6, wherein the first memory cell includes a second insulating layer provided between the first point and the first signal line, a charge storage film provided between the second insulating layer and the first signal line, and a third insulating layer provided between the charge storage film and the first signal line.

9. The device according to claim 6, wherein in a section passing through the first memory cell to the fourth memory cell, a distance between the first point and the second point is larger than a distance between the fifth point and the sixth point and a distance between the seventh point and the eighth point, and a distance between the third point and the fourth point is larger than a distance between the fifth point and the sixth point and a distance between the seventh point and the eighth point.

10. The device according to claim 6, wherein the first point to the eighth point are in one plane.

11. The device according to claim 6, wherein:

the first signal line is electrically coupled to a first bit line, the second signal line is electrically coupled to a second bit line, the third signal line is electrically coupled to a third bit line, and the fourth signal line is electrically coupled to a fourth bit line.

12. A semiconductor memory device comprising:

a wiring layer provided above a substrate;

a first insulating layer extending in a first direction perpendicular to the substrate and passing through a region surrounded by the wiring layer, the region being in a layer in which the wiring layer is provided;

a first signal line extending in the first direction and provided between the wiring layer and the first insulating layer;

a second signal line extending in the first direction and provided between the wiring layer and the first insulating layer;

a third signal line extending in the first direction and provided between the wiring layer and the first insulating layer;

a fourth signal line extending in the first direction and provided between the wiring layer and the first insulating layer;

a first memory cell provided between the first signal line and the wiring layer and configured to store first information;

a second memory cell provided between the second signal line and the wiring layer and configured to store second information;

a third memory cell provided between the third signal line and the wiring layer and configured to store third information; and a fourth memory cell provided between the fourth signal line and the wiring layer and configured to store fourth information.

13. The device according to claim 12, wherein:

the first signal line is electrically coupled to a first bit line, the second signal line is electrically coupled to a second bit line, the third signal line is electrically coupled to a third bit line, and the fourth signal line is electrically coupled to a fourth bit line.

* * * * *